(12) United States Patent
Grottenmueller et al.

(10) Patent No.: US 11,888,095 B2
(45) Date of Patent: Jan. 30, 2024

(54) MANUFACTURING PROCESS FOR AN OPTOELECTRONIC DEVICE

(71) Applicant: Merck Patent GmbH, Darmstadt (DE)

(72) Inventors: Ralf Grottenmueller, Wiesbaden (DE); Abraham Casas Garcia-Minguillan, Wiesbaden (DE); Fumio Kita, Wiesbaden (DE); Christoph Landmann, Darmstadt (DE); Fabian Blumenschein, Mossautal (DE)

(73) Assignee: MERCK PATENT GMBH, Darmstadt (DE)

( * ) Notice: Subject to any disclaimer, the term of this patent is extended or adjusted under 35 U.S.C. 154(b) by 962 days.

(21) Appl. No.: 16/755,175

(22) PCT Filed: Oct. 10, 2018

(86) PCT No.: PCT/EP2018/077539
§ 371 (c)(1),
(2) Date: Apr. 10, 2020

(87) PCT Pub. No.: WO2019/072881
PCT Pub. Date: Apr. 18, 2019

(65) Prior Publication Data
US 2021/0193879 A1  Jun. 24, 2021

(30) Foreign Application Priority Data
Oct. 13, 2017 (EP) ..................... 17196362

(51) Int. Cl.
*H01L 33/50* (2010.01)
*C08G 77/54* (2006.01)
(Continued)

(52) U.S. Cl.
CPC ............ *H01L 33/502* (2013.01); *C08G 77/54* (2013.01); *C08G 77/62* (2013.01); *C09K 11/02* (2013.01); *H01L 2933/0041* (2013.01)

(58) Field of Classification Search
CPC ........... H01L 33/502; H01L 2933/0041; H01L 2933/005
See application file for complete search history.

(56) References Cited

U.S. PATENT DOCUMENTS

| | | |
|---|---|---|
| 10,421,841 B2 | 9/2019 | Grottenmüller et al. |
| 2007/0001178 A1 | 1/2007 | Tran et al. |

(Continued)

FOREIGN PATENT DOCUMENTS

| | | | | |
|---|---|---|---|---|
| CN | 105789416 A | * | 7/2016 | ............. H01L 33/52 |
| CN | 105789416 A | | 7/2016 | |

(Continued)

OTHER PUBLICATIONS

M. Schulz et al. "Cross Linking Behavior of Preceramic Polymers Effected by UV-and Synchrotron Radiation", Advanced Engineering Materials; 2004, 6, No. 8, pp. 676-680.

(Continued)

*Primary Examiner* — Jay C Chang
*Assistant Examiner* — Mikka Liu
(74) *Attorney, Agent, or Firm* — MILLEN, WHITE, ZELANO & BRANIGAN, P.C.; Brion P. Heaney

(57) ABSTRACT

The present invention relates to a process for manufacturing an optoelectronic device, wherein a layer of a formulation containing a silazane polymer and a wavelength converting material is applied to an optoelectronic device precursor, precured by exposure to radiation and then cured. There is further provided an optoelectronic device, preferably a light (Continued)

emitting device (LED) or a micro-light emitting device (micro-LED), which is prepared by said manufacturing process.

18 Claims, 5 Drawing Sheets

(51) Int. Cl.
 *C08G 77/62* (2006.01)
 *C09K 11/02* (2006.01)

(56) References Cited

U.S. PATENT DOCUMENTS

| | | | |
|---|---|---|---|
| 2008/0107894 A1 | 5/2008 | Brand et al. | |
| 2008/0131706 A1 | 6/2008 | Brand et al. | |
| 2012/0256223 A1* | 10/2012 | Washizu | H01L 33/501 |
| | | | 257/E33.061 |
| 2013/0140591 A1 | 6/2013 | Tseng et al. | |
| 2013/0309437 A1* | 11/2013 | Kraeuter | C09K 11/08 |
| | | | 428/68 |
| 2015/0188006 A1 | 7/2015 | Williams et al. | |

FOREIGN PATENT DOCUMENTS

| | | |
|---|---|---|
| JP | 2011202018 A | 10/2011 |
| JP | 2014223578 A | 12/2014 |
| WO | 06056285 A1 | 6/2006 |
| WO | 06089649 A1 | 8/2006 |
| WO | 07012392 A2 | 2/2007 |
| WO | 17071788 A1 | 5/2017 |
| WO | 17140407 A1 | 8/2017 |

OTHER PUBLICATIONS

L. Prager et al. "Vacuum-UV Irradiation-Based Formation of Methyl-Si-O-Si Networks from Poly(1,1-Dimethylsilazane-co-1-methylsilazane)"; Chem. Eur. J. 2009, 15, pp. 675-683.
International Search report for PCT/EP2018/.

* cited by examiner

MANUFACTURING PROCESS FOR AN OPTOELECTRONIC DEVICE

TECHNICAL FIELD OF THE INVENTION

The present invention relates to a process for manufacturing an optoelectronic device, wherein a layer of a formulation containing a silazane polymer and a wavelength converting material is applied to an optoelectronic device precursor and precured by exposure to radiation. This process is successively carried out two or more times so that an optoelectronic device precursor comprising two or more precured layers arranged one above the other is obtained. The precured layers on the optoelectronic device precursor are then cured by exposure to heat or radiation. The present invention further relates to an optoelectronic device, preferably a light emitting device (LED) or a micro-light emitting device (micro-LED), which is prepared by said manufacturing process. The manufacturing process of the present invention allows a cost-efficient and fast production of optoelectronic devices, where the respectively desired colour point of the wavelength conversion can be specifically adjusted. Moreover, the manufacturing process allows a gentle production of optoelectronic devices such as e.g. packaged LEDs or packaged micro-LEDs, where the thermal stress is kept as low as possible. The optoelectronic device produced by said manufacturing process shows improved barrier properties, enhanced colour point stability and good mechanical and thermal stability.

BACKGROUND OF THE INVENTION

Optoelectronic devices such as e.g. LEDs or micro-LEDs play an increasingly important role in lighting and display technology. In many cases, it is necessary to convert light of a certain wavelength into light of another, usually a longer, wavelength. For this type of conversion, wavelength converting materials such as e.g. phosphors or semiconductor nanoparticles (quantum materials) are used. In the manufacturing of wavelength converting optoelectronic devices it is important to specifically control the desired colour point which results from the wavelength conversion. For example, recent advances in LED technology have resulted in LEDs having a small volume, light weight, high efficiency and long life.

For example, LEDs may be used in backlights for liquid crystal displays (LCDs) and micro-LEDs, which are gaining more and more importance, may be used for specific display applications such as for example in mobile phones or wearable smart electronic devices.

Recently, various attempts have been made to prepare white light sources, where blue, violet and/or UV light emitted from a light emitting diode is converted by wavelength converting materials emitting in the red (R), green (G), and blue (B) spectral ranges. Such wavelength converting materials are located near each other to diffuse and mix their emitted light. When generating white light with such an arrangement, it is difficult to generate white light of a desired colour point due to variations in the colour point, luminance, and other factors of the wavelength converting materials. Moreover, since the light emitting diodes are based on semiconductor materials, the colour point is varies due to differences in temperature characteristics, chronological changes, and operating conditions. Unevenness in colour may also be caused by failure to uniformly mix the light emitted by the wavelength converting materials or to uniformly coat the light emitting diodes with the wavelength converting materials.

Various processes have been described so far in the state of the art for the manufacturing of LEDs. In most processes one or more wavelength converting material is applied to a LED precursor containing a primary light source such as e.g. a semiconductor light emitting diode (LED chip) or a semiconductor laser diode (LD chips). Usually, the wavelength converting material is mixed with a binder (encapsulation material) to form a wavelength converting dispersion which is then applied to the LED precursor and subsequently fixed by curing. Various coating methods and binder materials have been described in the state of the art so far.

For example, silicones, such as e.g. phenylsilicone (Dow Corning OE-6550) and methylsilicone (Dow Corning OE-6370 HF) are known. Silicone based phosphor binders are usually cured by a thermally induced addition reaction of silicon-hydrogen and silicon-vinyl groups catalyzed by precious metal catalysts, preferably platinum or palladium compounds. Typical curing conditions for silicones are 4 h at 150° C. However, silicone-based materials suffer from various disadvantages such as a high gas permeability, outgassing of volatile organic compounds, a low refractive index and yellow discolouration which may lead to a reduced lifetime, reduced efficiency and undesired deviation of colour point. Polysilazanes such as organopoly-silazanes and organopolysiloxazanes have been recently described as alternatives to silicones in WO 2017/140407 A1 and WO 2017/071788 A1.

Typically, silicone based phosphor binders are thermally cured on LED precursors at temperatures of about 150° C. in an oven or on a hotplate. However, the curing of polysilazanes is much slower than the curing of silicones and needs higher temperatures which is a major challenge in terms of compatibility with the LED precursor. Not all LED precursors tolerate such high temperatures without suffering from damage.

Known methods for applying wavelength converting formulations to LED precursors are dispensing, dipping, screen printing, stencil printing, roller coating, spray coating, slot coating, spin coating or inkjet printing. Various manufacturing methods for LEDs are described in US 2007/0001178 A1 and US 2013/0140591 A1.

However, there is still some room for further improvement with respect to the preparation of well-defined uniform coatings of wavelength converting material which allows for a specific adjustment of colour distribution, colour temperature and colour point of a wavelength converting device with sufficient reliability. Furthermore, there is a need for novel manufacturing processes for optoelectronic devices, which are suitable for large-scale mass production and which allow for a faster curing at lower temperatures to minimize thermal stress.

OBJECT OF THE INVENTION

Hence, it is an object of the present invention to overcome the disadvantages in the prior art and to provide a new manufacturing process for optoelectronic devices which allows a well-defined and controlled deposition of uniform coatings of wavelength converting material on optoelectronic device precursors thereby offering an opportunity to specifically adjust colour distribution, colour temperature and colour point of the device with sufficient stability. It is a further object of the present invention to provide a new manufacturing process for optoelectronic devices which is suitable for large-scale mass production and which allows for a faster curing at lower temperatures thereby avoiding thermal stress on the optoelectronic device package.

Moreover, it is an object of the present invention to provide an optoelectronic device, preferably a wavelength converting optoelectronic device such as an LED or micro-LED, showing the above-mentioned advantages.

SUMMARY OF THE INVENTION

The present inventors have surprisingly found that the above-mentioned objects can be solved by a manufacturing process for an optoelectronic device comprising the following steps:

(a-1) applying a layer of a formulation comprising (i) a polymer containing a silazane repeating unit $M^1$, and (ii) at least one wavelength converting material to an optoelectronic device precursor;

(a-2) precuring the layer on the precursor by exposure to radiation;

(b) curing the precured layers on the precursor by exposure to heat or radiation;

wherein steps (a-1) and (a-2) are successively carried out two or more times, preferably three or more times, more preferably four or more times, before step (b) is carried out so that a precursor comprising two or more, preferably three or more, more preferably four or more, precured layers is obtained which is then subjected to the curing in step (b).

Moreover, an optoelectronic device is provided which is obtainable or obtained by the manufacturing process of the present invention.

Preferred embodiments of the present invention are described hereinafter and in the dependent claims.

DETAILED DESCRIPTION

Definitions

Figure 1:
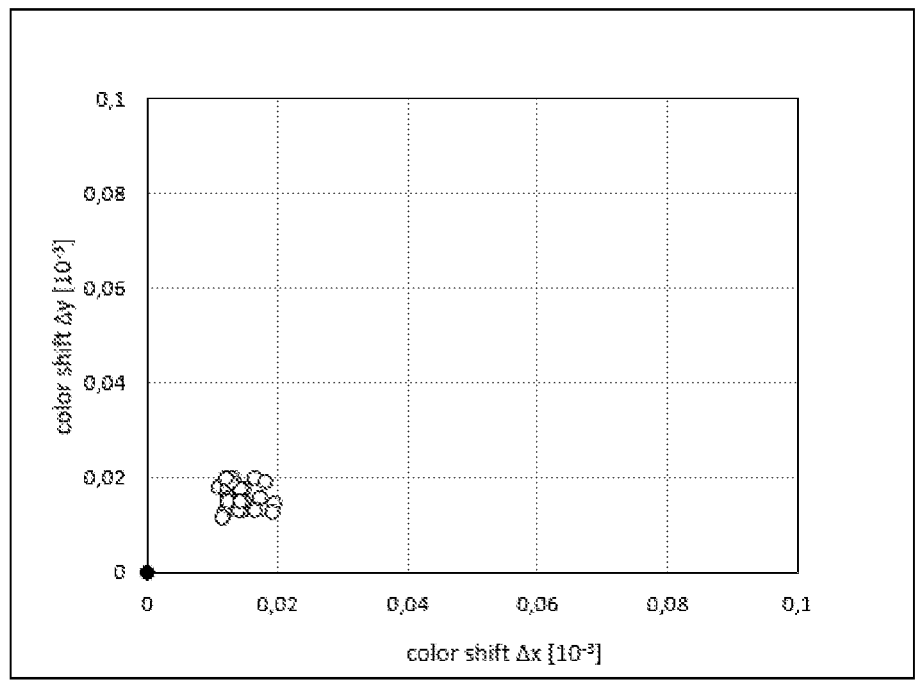
FIG. 1: Colour coordinates measured in Example 1 before and after final curing on a hotplate at 220° C. for 4 h.
●=before curing;
○=after curing.

The term "crosslinking" as used herein refers to a crosslinking reaction which may be induced by any kind of energy such as e.g. heat and/or radiation, and/or a catalyst. A crosslinking reaction involves sites or groups on existing polymers or an interaction between existing polymers that results in the formation of a small region in a polymer from which at least three chains emanate. Said small region may be an atom, a group of atoms, or a number of branch points connected by bonds, groups of atoms or oligomeric or polymeric chains.

The term "polymer" includes, but is not limited to, homopolymers, copolymers, for example, block, random, and alternating copolymers, terpolymers, quaterpolymers, etc., and blends and modifications thereof. Furthermore, unless otherwise specifically limited, the term "polymer" shall include all possible configurational isomers of the material. These configurations include, but are not limited to isotactic, syndiotactic, and atactic symmetries. A polymer is a molecule of high relative molecular mass, the structure of which essentially comprises the multiple repetition of units (i.e. repeating units) derived, actually or conceptually, from molecules of low relative mass (i.e. monomers).

The term "monomer" as used herein refers to a molecule which can undergo polymerization thereby contributing constitutional units (repeating units) to the essential structure of a polymer.

The term "homopolymer" as used herein stands for a polymer derived from one species of (real, implicit or hypothetical) monomer.

The term "copolymer" as used herein generally means any polymer derived from more than one species of monomer, wherein the polymer contains more than one species of corresponding repeating unit. In one embodiment the copolymer is the reaction product of two or more species of monomer and thus comprises two or more species of corresponding repeating unit. It is preferred that the copolymer comprises two, three, four, five or six species of repeating unit. Copolymers that are obtained by copolymerization of three monomer species can also be referred to as terpolymers. Copolymers that are obtained by copolymerization of four monomer species can also be referred to as quaterpolymers. Copolymers may be present as block, random, and/or alternating copolymers.

The term "block copolymer" as used herein stands for a copolymer, wherein adjacent blocks are constitutionally different, i.e. adjacent blocks comprise repeating units derived from different species of monomer or from the same species of monomer but with a different composition or sequence distribution of repeating units.

Further, the term "random copolymer" as used herein refers to a polymer formed of macromolecules in which the probability of finding a given repeating unit at any given site in the chain is independent of the nature of the adjacent repeating units. Usually, in a random copolymer, the sequence distribution of repeating units follows Bernoullian statistics.

The term "alternating copolymer" as used herein stands for a copolymer consisting of macromolecules comprising two species of repeating units in alternating sequence.

The term "polysilazane" as used herein refers to a polymer in which silicon and nitrogen atoms alternate to form the basic backbone. Since each silicon atom is bound to at least one nitrogen atom and each nitrogen atom to at least one silicon atom, both chains and rings of the general formula $[R^1R^2Si-NR^3]_m$ occur, wherein $R^1$ to $R^3$ are independently from each other hydrogen atoms or organic substituents; and m is an integer. If all substituents $R^1$ to $R^3$ are H atoms, the polymer is designated as perhydropolysilazane, polyperhydrosilazane or inorganic polysilazane ($[H_2Si-NH]_m$). If at least one substituent $R^1$ to $R^3$ is an organic substituent, the polymer is designated as organopolysilazane.

The term "polysiloxazane" as used herein refers to a polysilazane which additionally contains sections in which silicon and oxygen atoms alternate. Such section may be represented for example by $[O-SiR^4R^5]_n$, wherein $R^4$ and $R^5$ can be hydrogen atoms or organic substituents; and n is an integer. If all substituents of the polymer are H atoms, the polymer is designated as perhydropolysiloxazane. If at least one substituents of the polymer is an organic substituent, the polymer is designated as organopolysiloxazane.

Polymers having a silazane repeating unit $[R^1R^2Si-NR^3]_m$ as described above are typically referred to as polysilazanes or polysiloxazanes. While polysilazanes are composed of one or more different silazane repeating units, polysiloxazanes additionally contain one or more different siloxane repeating unit $[O-SiR^4R^5]_n$ as described above. The structure of polysilazanes or polysiloxazanes usually contains not only linear sections, but also separate or condensed rings and complex three-dimensional arrangements.

Polysilazanes and polysiloxazanes contain tertiary nitrogen atoms "$Si_3N$" (with respect to silicon) and possibly primary nitrogen atoms "$SiNR_2$" and secondary nitrogen atoms "$Si_2NR$". Likewise, they contain tertiary silicon atoms "$N_3SiR$" (with respect to nitrogen) and possibly primary silicon atoms "$NSiR_3$" and secondary silicon atoms "$N_2SiR_2$". The exact structure may vary depending on the specific synthesis and the nature of the substituents R.

Polysilazanes and polysiloxazanes are usually liquid polymers which become solid at molecular weights of ca.>10,000 g/mol. In most applications liquid polymers of moderate molecular weights, typically in the range from 2,000 to 8,000 g/mol, are used. For preparing a solid coating from such liquid polymers, a crosslinking reaction is required.

Polysilazanes or polysiloxazanes can be crosslinked by exposure to heat and/or different types of radiation. Exposure to heat shall particularly refer to processes where thermal energy is mainly transmitted by heat conduction and/or by heat convection such as e.g. in an oven or on a hotplate. Exposure to radiation shall particularly refer to processes where energy is transmitted in form of electromagnetic radiation including UV light, visible light, and IR light radiation. The latter also includes heat transfer by heat radiation. During crosslinking there is an increase in molecular weight and the material becomes solid. The crosslinking thus leads to a curing of the polysilazane or polysiloxazane material. For this reason, the terms "curing" and "crosslinking" and the corresponding verbs "cure" and "crosslink" are interchangeably used as synonyms in the present application when referred to silazane based polymers such as polysilazanes and polysiloxazanes. The respective crosslinking mechanisms are known to the skilled person.

Usually, crosslinking is performed by hydrolysis and starts at ambient conditions (20 to 25° C.) or at elevated temperatures of 150 to <250° C. To achieve complete crosslinking higher temperatures are required. If crosslinked organopolysilazanes or organopolysiloxazanes, where at least one substituent R is a carbon-containing substituent, are further heated to temperatures of >500° C., carbon is released as methane or carbon dioxide depending on the atmosphere conditions and a silicon-nitride type or silicon-oxynitride type ceramic is formed.

The term "optoelectronic device" as used herein refers to electronic devices and systems that source, detect and control light. In this context, light often includes invisible forms of radiation such as gamma rays, X-rays, ultraviolet (UV) and infrared (IR), in addition to visible light. Optoelectronic devices are electrical-to-optical or optical-to-electrical transducers, or instruments that use such devices in their operation. Optoelectronic devices are based on quantum mechanical effects of light on electronic materials, especially semiconductors, sometimes in the presence of electric fields. Preferred optoelectronic devices in the context of the present application are optoelectronic devices where light conversion may takes place by the presence of wavelength converting materials such as e.g. in LEDs (especially, phosphor-converted LEDs) and micro-LEDs.

The term "LED" as used herein refers to light emitting devices comprising one or more of a light emitting source, lead frame, wiring, solder (flip chip), converter, filling material, encapsulation material, primary optics and/or secondary optics. Semiconductor light emitting sources may be selected from semiconductor light emitting diodes (LED chips) or semiconductor laser diodes (LD chips). An LED chip is a chip of semiconducting material doped with impurities to create a p-n-junction. As in other diodes, current flows easily from the p-side, or anode, to the n-side, or cathode, but not in the reverse direction. Charge-carriers—electrons and holes—flow into the junction from electrodes with different voltages. When an electron meets a hole, it falls into a lower energy level and releases energy in the form of a photon. The wavelength of the light emitted, and thus its colour, depends on the band gap energy of the materials forming the p-n junction. In silicon or germanium diodes, the electrons and holes usually recombine by a non-radiative transition, which produces no optical emission, because these are indirect band gap materials. The materials used for the LED chip have a direct band gap with energies corresponding to near-infrared, visible, or near-ultraviolet light. LED chip development began with infrared and red devices made with gallium arsenide. Advances in materials science have enabled making devices with ever-shorter wavelengths, emitting light in a variety of colours. LED chips are usually built on an n-type substrate, with an electrode attached to the p-type layer deposited on its surface. P-type substrates, while less common, occur as well. Many commercial LED chips, especially GaN/InGaN, also use sapphire substrate. An LED may be prepared from an LED precursor containing a semiconductor light source (LED chip) and/or lead frame and/or gold wire and/or solder (flip chip) on which a wavelength converting material is applied.

The term "micro-LED" or "mLED" as used herein refers to a flat panel display technology. As the name implies, mLED displays consist of arrays of microscopic LEDs forming the individual pixel elements. When compared to the widespread LCD technology, mLED displays offer better contract, response times, and energy efficiency. mLEDs are primarily aimed at small, low-energy devices such as smartwatches and smartphones. mLED offers greatly reduced energy requirements compared to conventional LCD systems. mLED is based on conventional GaN LED technology, which offers far higher total brightness than OLED products, as much as 30 times, as well as higher efficiency in terms of lux/W.

The term "wavelength converting material" or briefly referred to as a "converter" means a material that converts light of a first wavelength to light of a second wavelength, wherein the second wavelength is different from the first wavelength. This process is also referred to as light conversion. Wavelength converting materials are e.g. phosphors and semiconductor nanoparticles (quantum materials).

A "phosphor" is a fluorescent inorganic material which contains one or more light emitting centers. The light emitting centers are formed by activator elements such as e.g. atoms or ions of rare earth metal elements, for example La, Ce, Pr, Nd, Pm, Sm, Eu, Gd, Tb, Dy, Ho, Er, Tm, Yb and Lu, and/or atoms or ions of transition metal elements, for example Cr, Mn, Fe, Co, Ni, Cu, Ag, Au and Zn, and/or atoms or ions of main group metal elements, for example Na, TI, Sn, Pb, Sb and Bi. Examples of suitable phosphors include phosphors based on garnet, silicate, orthosilicate, thiogallate, sulfide, nitride, silicon-based oxynitride, nitridosilicate, nitridoaluminumsilicate, oxonitridosilicate, oxonitridoaluminumsilicate and rare earth doped sialon. Phosphors within the meaning of the present application are materials which absorb electromagnetic radiation of a specific wavelength range, preferably blue and/or ultraviolet (UV) electromagnetic radiation, and convert the absorbed electromagnetic radiation into electromagnetic radiation having a different wavelength range, preferably visible (VIS) light such as violet, blue, green, yellow, orange or red light.

The term "semiconductor nanoparticle" or "quantum materials" in the present application denotes a crystalline nanoparticle which consists of a semiconductor material. Semiconductor nanoparticles represent a class of nanomaterials with physical properties that are widely tunable by controlling particle size, composition and shape. Among the most evident size dependent property of this class of materials is the tunable fluorescence emission. The tunability is afforded by the quantum confinement effect, where reducing particle size leads to a "particle in a box" behavior, resulting in a blue shift of the band gap energy and hence the light emission. For example, in this manner, the emission of CdSe nanocrystals can be tuned from 660 nm for particles of diameter of ~6.5 nm, to 500 nm for particles of diameter of ~2 nm. Similar behavior can be achieved for other semiconductors when prepared as nanocrystals allowing for broad spectral coverage from the UV (using ZnSe, CdS for example) throughout the visible (using CdSe, InP for example) to the near-IR (using InAs for example).

Suitable materials for semiconductor nanoparticles are selected from groups II-VI, III-V, IV-VI or I-III-VI$_2$ or any desired combination of one or more thereof. For example, the semiconductor material may be CdS, CdSe, CdTe, ZnS, ZnSe, ZnTe, ZnO, GaAs, GaP, GaAs, GaSb, GaN, HgS, HgSe, HgTe, InAs, InP, InSb, AlAs, AlP, AlSb, Cu$_2$S, Cu$_2$Se, CuGaS$_2$, CuGaSe$_2$, CuInS$_2$, CuInSe$_2$, Cu$_2$(InGa)S$_4$, AgInS$_2$, AgInSe$_2$, Cu$_2$(ZnSn)S$_4$, alloys thereof and mixtures thereof.

Semiconductor nanoparticles are any desired discrete units having at least one dimension in the sub-micron size, which, in some embodiments, is less than 100 nm and in some other embodiments has a size of less than one micron as the largest dimension (length). In some other embodiments, the dimension is less than 400 nm. The semiconductor nanoparticle can have any desired symmetrical or asymmetrical geometrical shape, and non-restrictive examples of possible shapes are elongate, round, elliptical, pyramidal, etc. A specific example of a semiconductor nanoparticle is an elongate nanoparticle, which is also called a nanorod and is made from a semiconducting material. Further semiconductor nanorods which can be used are those having a metal or metal-alloy region on one or both ends of the respective nanorod. Examples of such elongate semiconductor/metal nanoparticles and the production thereof are described in WO 2005/075339 A2, the disclosure content of which is incorporated herein by way of reference. Other possible semiconductor/metal nanoparticles are shown in WO 2006/134599 A1, the disclosure content of which is incorporated herein by way of reference.

Furthermore, semiconductor nanoparticles in a core/shell configuration or a core/multishell configuration are known. These are discrete semiconductor nanoparticles which are characterised by a heterostructure, in which a "core" comprising one type of material is covered with a "shell" comprising another material. In some cases, the shell is allowed to grow on the core, which serves as "seed core". The core/shell nanoparticles are then also referred to as "seeded" nanoparticles. The expression "seed core" or "core" relates to the innermost semiconductor material present in the hetero-structure. Known semiconductor nanoparticles in core/shell configuration are shown, for example, in EP 2 528 989 B1, the contents of which are incorporated into the present description in their totality by way of reference.

Semiconductor nanoparticles may be also employed as semiconductor nanoparticles on the surface of non-activated crystalline materials. In such converters, one or more types of semiconductor nanoparticles (quantum materials) are located on the surface of one or more types of non-activated crystalline materials such as e.g. non-activated phosphor matrix materials. Such converters are also referred to as quantum material on phosphor matrix (QMOP).

As used herein, the term "non-activated crystalline material" denotes an inorganic material in particle form which is crystalline and does not have an activator, i.e. light converting centres. The non-activated crystalline material is thus itself neither luminescent nor fluorescent. In addition, it has no specific inherent absorption in the visible region and is consequently colourless. Furthermore, the non-activated crystalline material is transparent. The non-activated crystalline material serves as support material for the semiconductor nanoparticles. Owing to the lack of colour and the transparency of the non-activated crystalline material, light emitted by a primary light source or by another wavelength converting material is able to pass through the material unhindered and with no losses.

Preferred non-activated crystalline materials are matrix materials of an inorganic phosphor selected from non-activated crystalline metal oxides, non-activated crystalline silicates and halosilicates, non-activated crystalline phosphates and halophosphates, non-activated crystalline borates and borosilicates, non-activated crystalline aluminates, gallates and alumosilicates, non-activated crystalline molybdates and tungstates, non-activated crystalline sulfates, sulfides, selenides and tellurides, non-activated crystalline nitrides and oxynitrides, non-activated crystalline SiAlONs and other non-activated crystalline materials, such as non-activated crystalline complex metal-oxygen compounds, non-activated crystalline halogen compounds and non-activated crystalline oxy compounds, such as preferably oxysulfides or oxychlorides.

Suitable semiconductor nanoparticles on non-activated crystalline materials are described in WO 2017/041875 A1 the disclosure of which is hereby incorporated by reference.

The term "encapsulation material" or "encapsulant" as used herein means a material which covers or encloses a wavelength converting material. The encapsulation material may be regarded as a matrix embedding the converter particles. Preferably, the encapsulation material forms part of a wavelength converting layer which contains one or more wavelength converting materials and optionally one or more filling materials. The encapsulation material forms a barrier against the external environment of the LED, thereby protecting the converter and/or the LED chip. External environmental influences against which the encapsulation material needs to protect the LED may be of chemical nature such as moisture, acids, bases, oxygen, etc. or of physical nature such as temperature, mechanical impact, or stress. The encapsulation material usually acts as a binder for the converter. The encapsulating material is preferably in direct contact with the converter and/or the LED chip. Usually, the encapsulation material forms part of an LED package comprising an LED chip and/or lead frame and/or gold wire, and/or solder (flip chip), an optional filling material, converter and a primary and secondary optic. The encapsulation material may fully or partially cover the LED chip and/or lead frame and/or gold wire.

The term "Lewis acid" as used herein means a molecular entity (and the corresponding chemical species) that is an electron-pair acceptor and therefore able to react with a Lewis base to form a Lewis adduct, by sharing the electron pair furnished by the Lewis base. A "Lewis base" as used herein is a molecular entity (and the corresponding chemical species) that is able to provide a pair of electrons and thus capable of coordination to a Lewis acid, thereby forming a Lewis adduct. A "Lewis adduct" is an adduct formed between a Lewis acid and a Lewis base.

PREFERRED EMBODIMENTS

Process for Manufacturing

The present invention relates to a manufacturing process for an optoelectronic device which comprises the following steps:

(a-1) applying a layer of a formulation comprising (i) a polymer containing a silazane repeating unit $M^1$, and (ii) at least one wavelength converting material to an optoelectronic device precursor;

(a-2) precuring the layer on the precursor by exposure to radiation;

(b) curing the precured layers on the precursor by exposure to heat or radiation;

wherein steps (a-1) and (a-2) are successively carried out two or more times, preferably three or more times, more preferably four or more times, before step (b) is carried out so that a precursor comprising two or more, preferably three or more, more preferably four or more, precured layers is obtained which is then subjected to the curing in step (b).

In a preferred embodiment the radiation for the precuring in step (a-2) is selected from UV light, visible light, and IR light. The irradiation enables a selective and efficient precuring of the formulation on the precursor without generating excessive thermal stress. In addition to generating heat, the radiation can also trigger chemical reactions in the formulation applied as a layer such as crosslinking reactions. This effect particularly occurs, if UV-C light is used for irradiation.

It is preferred that only the layer on top of the precursor is exposed to radiation. Thus, the layer can reach temperatures of >250° C., while the temperature of the precursor or layers underneath the top layer stays at <150° C. If the temperature for precuring the top layer needs to be maintained for a longer time so that the temperature of the precursor gets too high, the radiation can be preferably applied in short flashes. Optionally, a mask can be used to protect the non-coated parts of the precursor. This may be important, in particular, if UV-C light is used and the packaging material is an organic plastic sensitive to short wavelength light.

It is preferred that the UV light is electromagnetic radiation with a wavelength of <380 nm, more preferably a wavelength from 100 to 380 nm. More preferably, the UV light is selected from UV-A light having a wavelength from 315 to 380 nm, UV-B light having a wavelength from 280 to 315 nm, and UV-C light having a wavelength from 100 to 280 nm.

It is preferred that the visible light is electromagnetic radiation with a wavelength from >380 to 780 nm, more preferably from >380 to 500 nm.

It is preferred that the IR light is electromagnetic radiation with a wavelength from >780 nm to 1.0 mm, more preferably from 1.0 pm to 20 µm.

In a particularly preferred embodiment the radiation for the precuring in step (a-2) has a wavelength from 200 to 350 nm. In an alternative particularly preferred embodiment the radiation for the precuring step (a-2) has a wavelength from 5 to 15 µm.

As UV light sources Hg-vapor lamps or UV-lasers are possible, as IR light sources ceramic-emitters or IR-laser diodes are possible and for light in the visible area laser diodes are possible.

Preferred UV light sources are light sources having a) a single wavelength radiation with a maximum of <255 nm such as e.g. 254 nm and 185 nm Hg low-pressure discharge lamps, 193 nm ArF excimer laser and 172 nm Xe2 layer, or b) broad wavelength distribution radiation with a wavelength component of <255 m such as e.g. non-doped Hg low-pressure discharge lamps.

Figure 10:
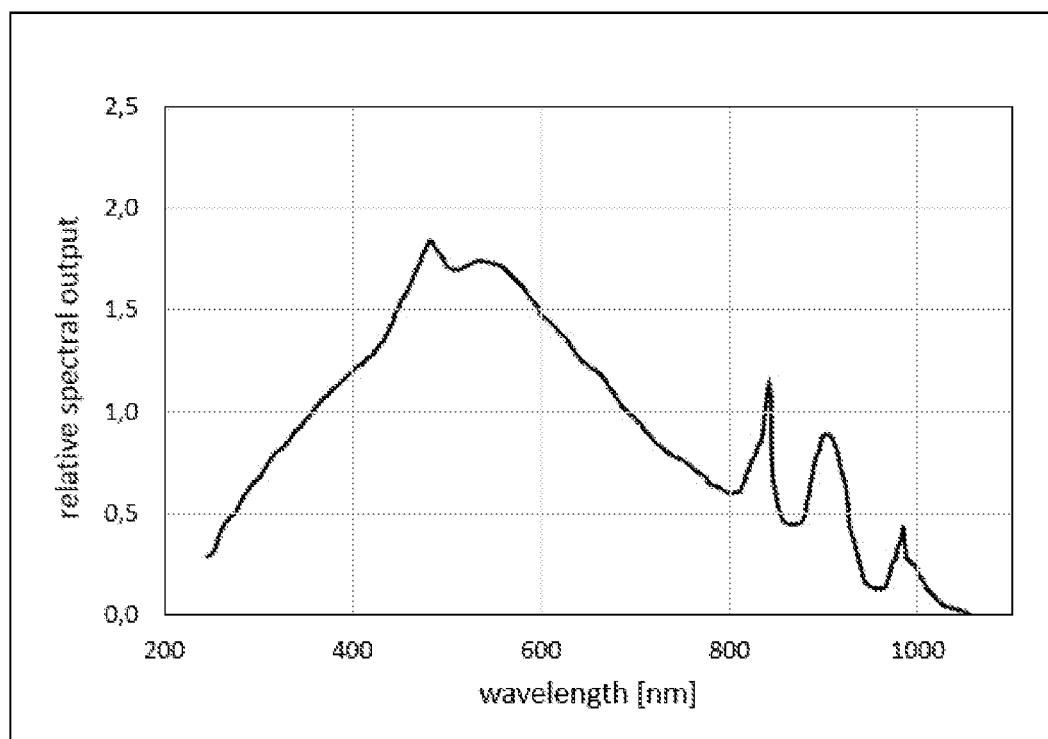
FIG. 10: Emission spectrum of a Xenon flash lamp, available from Heraeus, Germany.

In a preferred embodiment of the present invention the light source is a Xenon flash light (see FIG. 10). Preferably, the Xenon flash light has a broad emission spectrum with a short wavelength component going down to about 200 nm.

The application method by which the formulation is applied in step (a-1) is not particularly limited. Preferred application methods for step (a-1) are selected from dispensing, dipping, screen printing, stencil printing, roller coating, spray coating, slot coating, spin coating or inkjet printing. More preferably, the layer of the formulation is applied in step (a-1) by spray coating. The layer of the formulation which is applied in step (a-1) has preferably an average thickness of 1 to 20 μm, more preferably 2 to 15 μm, and most preferably 3 to 12 μm.

In a preferred embodiment, the irradiation in step (a-2) takes place for a period of 1 sec to 10 min, more preferably for a period of 10 sec to 7 min, particularly preferably for a period of 30 sec to 4 min, and most preferably for a period of 30 sec to 2 min.

In a preferred embodiment, steps (a-1) and (a-2) are successively carried out three or more times, more preferably four or more times, before step (b) is carried out so that a precursor comprising three or more, more preferably four or more, precured layers is obtained which is then subjected to the curing in step (b). After each individual application of a layer, a precuring of the applied layer takes place so that an arrangement of several precured layers arranged one above the other is obtained.

Hence, the precursor contains multiple individual precured layers which are arranged one above the other to form a multi-layer structure, wherein each layer is individually applied and precured. By this approach, the thickness of the wavelength converting layer can be selectively controlled which facilitates a precise adjustment of the colour point of the optoelectronic device. It is preferred that the precuring of each individual layer takes place immediately after its application in order to avoid reflow or rearrangement of said layer before the next layer is applied on top. Moreover, it is advantageous that the precuring takes pace in a relatively short time of preferably at most 2 min, more preferably at most 1 min. This is particularly advantageous, if spray coating is used for application.

The method for the curing in step (b) is not particularly limited as long as the precured layers are exposed to radiation and/or heat so that a complete curing takes place. Preferred radiation for the curing in step (b) is selected from UV light, visible light, and IR light as defined above for the precuring in step (a-2). Preferably, irradiation in step (b) takes place for a period of 30 sec to 30 min, more preferably for a period of 1 min to 20 min, and most preferably for a period of 1 min to 10 min. If the curing in step (b) takes place by heat, various heat sources may be used, which allow a heat transfer by heat conduction or heat convection, such as e.g. a heater, an oven or dried hot air. Preferably, heating in step (b) takes place for a period of 10 min to 10 h, more preferably for a period of 30 min to 7 h, and most preferably for a period of 1 to 4 h. Preferred temperatures for the curing in step (b) by heat are 200 to 260° C., more preferably 210 to 240° C., and most preferably 215 to 225° C.

Preferably, the polymer, which is comprised in the formulation applied in step (a-1), contains a repeating unit $M^1$ and a further repeating unit $M^2$, wherein $M^1$ and $M^2$ are silazane units which are different from each other. Preferably, the polymer contains a repeating unit $M^1$ and a further repeating unit $M^3$, wherein $M^1$ is a silazane unit and $M^3$ is a siloxazane unit. More preferably, the polymer contains a repeating unit $M^1$, a further repeating unit $M^2$ and a further repeating unit $M^3$, wherein $M^1$ and $M^2$ are silazane units which are different from each other and $M^3$ is a siloxazane unit.

In a preferred embodiment the polymer is a polysilazane. Preferably, the polysilazane contains a repeating unit $M^1$ and optionally a further repeating unit $M^2$, wherein $M^1$ and $M^2$ are silazane repeating units which are different from each other. It is preferred that at least one of $M^1$ and $M^2$ is an organosilazane unit so that the polymer is an organopolysiazane.

In an alternative preferred embodiment the polymer is a polysiloxazane. Preferably, the polysiloxazane contains a repeating unit $M^1$ and a further repeating unit $M^3$, wherein $M^1$ is a silazane unit and $M^3$ is a siloxazane unit. More preferably, the polysiloxazane contains a repeating unit $M^1$, a further repeating unit $M^2$ and a further repeating unit $M^3$, wherein $M^1$ and $M^2$ are silazane units which are different from each other and $M^3$ is a siloxazane unit. It is preferred that at least one of $M^1$ and $M^2$ is an organosilazane unit so that the polymer is an organopolysiloxazane.

In a particularly preferred embodiment the polymer, which is comprised in the formulation applied in step (a-1), is a mixture of a polysilazane and a polysiloxazane as defined above. In a most preferred embodiment the polymer is a mixture of an organopolysilazane and organopolysiloxazane.

Preferably, the silazane repeating unit $M^1$ is represented by formula (I):

$$—[—SiR^1R^2—NR^3—]—  \qquad (I)$$

wherein $R^1$, $R^2$ and $R^3$ are independently from each other hydrogen or alkyl.

It is preferred that $R^1$, $R^2$ and $R^3$ in formula (I) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^1$, $R^2$ and $R^3$ are independently from each other selected from the group consisting of hydrogen, straight-chain alkyl having 1 to 6 carbon atoms, branched-chain alkyl having 3 to 6 alkyl atoms and cycloalkyl having 3 to 6 carbon atoms. Most preferably, $R^1$, $R^2$ and $R^3$ are independently from each other hydrogen, methyl, ethyl, propyl, butyl, pentyl or hexyl.

In a preferred embodiment, the polymer contains besides the silazane repeating unit $M^1$ a further repeating unit $M^2$ which is represented by formula (II):

$$—[—SiR^4R^5—NR^6—]—  \qquad (II)$$

wherein $R^4$, $R^5$ and $R^6$ are independently from each other hydrogen or alkyl; and wherein $M^2$ is different from $M^1$.

It is preferred that $R^4$, $R^5$ and $R^6$ in formula (II) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^4$, $R^5$ and $R^6$ are independently from each other selected from the group consisting of hydrogen, straight-chain alkyl having 1 to 6 carbon atoms, branched-chain alkyl having 3 to 6 carbon atoms and cycloalkyl having 3 to 6 carbon atoms. Most preferably, $R^4$, $R^5$ and $R^6$ are independently from each other hydrogen, methyl, ethyl, propyl, butyl, pentyl or hexyl.

In a further preferred embodiment, the polymer is a polysiloxazane which contains besides the silazane repeating unit $M^1$ a further repeating unit $M^3$ which is represented by formula (III):

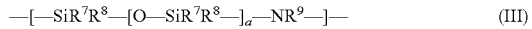

(III)

wherein $R^7$, $R^8$, $R^9$ are independently from each other hydrogen or organyl; and a is an integer from 1 to 60, preferably from 1 to 50. More preferably, a may be an integer from 5 to 50 (long chain monomer $M^3$); or a may be an integer from 1 to 4 (short chain monomer $M^3$).

It is preferred that $R^7$, $R^8$ and $R^9$ in formula (III) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms. More preferably, $R^7$, $R^8$ and $R^9$ are independently from each other selected from the group consisting of hydrogen, straight-chain alkyl having 1 to 6 carbon atoms, branched-chain alkyl having 3 to 6 carbon atoms and cycloalkyl having 3 to 6 carbon atoms. Most preferably, $R^7$, $R^8$ and $R^9$ are independently from each other hydrogen, methyl, ethyl, propyl, butyl, pentyl or hexyl.

With respect to $R^1$, $R^2$, $R^3$, $R^4$, $R^5$, $R^6$, $R^7$, $R^8$ and $R^9$ the straight-chain alkyl groups, branched-chain alkyl groups and cycloalkyl groups may be substituted with one or more substituents $R_S$ which may be the same or different from each other, wherein $R_S$ is selected from F, C and $SiMe_3$.

With respect to $R^1$, $R^2$, $R^3$, $R^4$, $R^5$, $R^6$, $R^7$, $R^8$ and $R^9$ it is more preferred that the straight-chain alkyl groups, branched-chain alkyl groups and cycloalkyl groups are not substituted.

With respect to $R^1$, $R^2$, $R^3$, $R^4$, $R^5$, $R^6$, $R^7$, $R^8$ and $R^9$ it is preferred that the they are independently selected from hydrogen, straight-chain alkyl and branched-chain alkyl.

With respect to $R^1$, $R^2$, $R^3$, $R^4$, $R^5$, $R^6$, $R^7$, $R^8$ and $R^9$ it is more preferred that they are independently selected from hydrogen and straight-chain alkyl.

With respect to $R^1$, $R^2$, $R^3$, $R^4$, $R^5$, $R^6$, $R^7$, $R^8$ and $R^9$ preferred straight-chain alkyl groups are methyl, ethyl, n-propyl, n-butyl, n-pentyl and n-hexyl.

With respect to $R^1$, $R^2$, $R^3$, $R^4$, $R^5$, $R^6$, $R^7$, $R^8$ and $R^9$ preferred branched-chain alkyl groups may be selected from iso-propyl (1-methylethyl), sec-butyl (1-methylpropyl), iso-butyl (2-methylpropyl), tert-butyl (1,1-dimethylethyl), sec-pentyl (pentan-2-yl), 3-pentyl (pentan-3-yl), iso-pentyl (3-methyl-butyl), neo-pentyl (2,2-dimethyl-propyl) and tert-pentyl (2-methylbutan-2-yl), more preferably from iso-propyl (1-methylethyl), sec-butyl (1-methylpropyl), iso-butyl (2-methylpropyl) and tert-butyl (1,1-dimethylethyl).

With respect to $R^1$, $R^2$, $R^3$, $R^4$, $R^5$, $R^6$, $R^7$, $R^8$ and $R^9$ preferred cycloalkyl groups may be selected from cyclopropyl, cyclobutyl, cyclopentyl and cyclohexyl.

It is understood that the skilled person can freely combine the above-mentioned preferred, more preferred and most preferred embodiments relating to the substituents $R^1$, $R^2$, $R^3$, $R^4$, $R^5$, $R^6$, $R^7$, $R^8$ and $R^9$ in the polymer in any desired way.

Preferably, the polymer is a copolymer such as a random copolymer or a block copolymer or a copolymer containing at least one random sequence section and at least one block sequence section. More preferably, the polymer is a random copolymer or a block copolymer.

It is preferred that the polymer is an organopolysilazane, wherein at least one of the substituents $R^1$, $R^2$ and $R^3$ is a straight-chain alkyl group, a branched-chain alkyl group or a cycloalkyl group.

It is preferred that the polymer is an organopolysiloxazane, wherein at least one of the substituents $R^1$, $R^2$ and $R^3$ is a straight-chain alkyl group, a branched-chain alkyl group or a cycloalkyl group.

Preferably, the polymers comprised in the formulation applied in step (a-1), have a molecular weight $M_w$, as determined by GPC, of at least 1,000 g/mol, more preferably of at least 2,000 g/mol, even more preferably of at least 3,000 g/mol. Preferably, the molecular weight $M_w$ of the polymers is less than 100,000 g/mol. More preferably, the molecular weight $M_w$ of the polymers is in the range from 3,000 to 50,000 g/mol.

Preferably, the total content of the polymer in the formulation is in the range from 1 to 99.5% by weight, preferably from 5 to 99% by weight.

In a preferred embodiment, the formulation contains one or more solvents. Suitable solvents for the formulation are, in particular, organic solvents which contain no water and also no reactive groups such as hydroxyl groups. These solvents are, for example, aliphatic or aromatic hydrocarbons, halogenated hydrocarbons, esters such as ethyl acetate or butyl acetate, ketones such as acetone or methyl ethyl ketone, ethers such as tetrahydrofuran or dibutyl ether, and also mono- and polyalkylene glycol dialkyl ethers (glymes), or mixtures of these solvents.

The formulation is liquid and can be applied to the optoelectronic device precursor by any known method for applying wavelength converting formulations such as e.g. dispensing, dipping, screen printing, stencil printing, roller coating, spray coating, slot coating, spin coating or inkjet printing.

In a preferred embodiment, the formulation contains a curing catalyst.

Suitable curing catalysts are e.g. Lewis acids as described in unpublished EP patent application Nos. 16201982.2 and 16201984.8.

In a particularly preferred embodiment the Lewis acid curing catalyst in the formulation is selected from the group consisting of triarylboron compounds such as e.g. $B(C_6H_5)_3$ and $B(C_6F_5)_3$, triarylaluminum compounds such as e.g. $Al(C_6H_5)_3$ and $Al(C_6F_5)_3$, palladium acetate, palladium acetylacetonate, palladium propionate, nickel acetylacetonate, silver acetylacetonate, platinum acetylacetonate, ruthenium acetylacetonate, ruthenium carbonyls, copper acetylacetonate, aluminum acetylacetonate, and aluminum tris (ethyl acetoacetate).

Depending on the catalyst system used, the presence of moisture or oxygen may play a role in the curing of the polymer. For instance, through the choice of a suitable catalyst system, it is possible to achieve rapid curing at high or low atmospheric humidity or at high or low oxygen content. The skilled worker is familiar with these influences and will adjust the atmospheric conditions appropriately by means of suitable optimization methods.

Preferably, the amount of the Lewis acid curing catalyst in the formulation is ≤10 weight-%, more preferably ≤5.0 weight-%, and most preferably ≤1.00 weight-%. Preferred ranges for the amount of the curing catalyst in the formulation are from 0.001 to 10 weight-%, more preferably from 0.001 to 5.0 weight-%, and most preferably from 0.001 to 1.00 weight-%.

Preferably, the formulation may comprise one or more additives selected from the group consisting of fillers, nanoparticles, viscosity modifiers, surfactants, additives influencing film formation, additives influencing evaporation behavior and cross-linkers.

Preferred fillers are glass particles which preferably have a particle diameter of <10 µm. Such fillers may further improve the mechanical stability of the wavelength converting layer. Preferred nanoparticles are selected from nitrides, titanates, diamond, oxides, sulfides, sulfites, sulfates, silicates and carbides which may be optionally surface-modified with a capping agent. Preferably, nanoparticles are materials having a particle diameter of <100 nm, more preferably <80 nm, even more preferably <60 nm, even more preferably <40 nm, and most more preferably <20 nm. The particle diameter may be determined by any standard method known to the skilled person.

If the refractive index of the wavelength converting layer is to be further increased, it is preferred to add selected nanoparticles having a refractive index of >2.0. Such selected nanoparticles are for example $TiO_2$ and $ZrO_2$. The refractive index may be determined by any standard method known to the skilled person.

It is preferred that the at least one wavelength converting material in the formulation is selected from phosphors or semiconductor nanoparticles (quantum materials). Semiconductor nanoparticles can be present either in pure form or on the surface of a non-activated crystalline material.

For the purposes of the present application, the type of phosphor is not particularly limited so that any type of phosphor may be used as wavelength converting material in the formulation. Suitable phosphors are well known to the skilled person and can easily be obtained from commercial sources.

Examples of suitable phosphors are inorganic fluorescent materials in particle form comprising one or more emitting centers. Such emitting centers may, for example, be formed by the use of so-called activators, which are preferably atoms or ions selected from the group consisting of rare earth elements, transition metal elements, main group elements and any combination of any of these. Examples of suitable rare earth elements may be selected from the group consisting of La, Ce, Pr, Nd, Pm, Sm, Eu, Gd, Tb, Dy, Ho, Er, Tm, Yb and Lu. Examples of suitable transition metal elements may be selected from the group consisting of Cr, Mn, Fe, Co, Ni, Cu, Ag, Au and Zn. Examples of suitable main group elements may be selected from the group consisting of Na, Tl, Sn, Pb, Sb and Bi. Examples of suitable phosphors include phosphors based on garnets, silicates, orthosilicates, thiogallates, sulfides, nitrides, silicon-based oxynitrides, nitridosilicates, nitridoaluminumsilicates, oxonitridosilicates, oxonitridoaluminumsilicates and rare earth doped sialons.

Phosphors which may be used as wavelength converting material within the present invention are, for example: $Ba_2SiO_4:Eu^{2+}$, $Ba_3SiO_5:Eu^{2+}$, $(Ba,Ca)_3SiO_5:Eu^{2+}$, $BaSi_2O_5:Pb^{2+}$, $Ba_xSr_{1-x}F_2:Eu^{2+}$ (wherein $0 \le x \le 1$), $BaSrMgSi_2O_7:Eu^{2+}$, $BaTiP_2O_7$, $(Ba,Ti)_2P_2O_7:Ti$, $Ba_3WO_6:U$, $BaY_2F_8:Er^{3+},Yb^+$, $Be_2SiO_4:Mn^{2+}$, $Bi_4Ge_3O_{12}$, $CaAl_2O_4:Ce^{3+}$, $CaLa_4O_7:Ce^{3+}$, $CaAl_2O_4:Eu^{2+}$, $CaAl_2O_4:Mn^{2+}$, $CaAl_4O_7:Pb^{2+}$, $Mn^{2+}$, $CaAl_2O_4:Tb^{3+}$, $Ca_3Al_2Si_3O_{12}:Ce^{3+}$, $Ca_3Al_2Si_3O_{12}:Eu^{2+}$, $Ca_2B_5O_9Br:Eu^{2+}$, $Ca_2B_5O_9Cl:Eu^{2+}$, $Ca_2B_5O_9Cl:Pb^{2+}$, $CaB_2O_4:Mn^{2+}$, $Ca_2B_2O_5:Mn^{2+}$, $CaB_2O_4:Pb^{2+}$, $CaB_2P_2O_9:Eu^{2+}$, $Ca_5B_2SiO_{10}:Eu^{3+}$, $Ca_{0.5}Ba_{0.5}Al_{12}O_{19}:Ce^{3+}$, $Mn^{2+}$, $Ca_2Ba_3(PO_4)_3Cl:Eu^{2+}$, $CaBr_2:Eu^{2+}$ in $SiO_2$, $CaCl_2):Eu^{2+}$ in $SiO_2$, $CaCl_2):Eu^{2+},Mn^{2+}$ in $SiO_2$, $CaF_2:Ce^{3+}$, $CaF_2:Ce^{3+},Mn^{2+}$, $CaF_2:Ce^{3+},Tb^{3+}$, $CaF_2:Eu^{2+}$, $CaF_2:Mn^{2+}$, $CaF_2:U$, $CaGa_2O_4:Mn^{2+}$, $CaGa_4O_7:Mn^{2+}$, $CaGa_2S_4:Ce^{3+}$, $CaGa_2S_4:Eu^{2+}$, $CaGa_2S_4:Mn^{2+}$, $CaGa_2S_4:Pb^{2+}$, $CaGeO_3:Mn^{2+}$, $CaI_2:Eu^{2+}$ in $SiO_2$, $CaI_2:Eu^{2+},Mn^{2+}$ in $SiO_2$, $CaLaBO_4:Eu^{3+}$, $CaLaB_3O_7:Ce^{3+},Mn^{2+}$, $Ca_2La_2BO_{6.5}:Pb^{2+}$, $Ca_2MgSi_2O_7$, $Ca_2MgSi_2O_7:Ce^{3+}$, $CaMgSi_2O_6:Eu^{2+}$, $Ca_3MgSi_2O:Eu^{2+}$, $Ca_2MgSi_2O_7:Eu^{2+}$, $CaMgSi_2O_6:Eu^{2+},Mn^{2+}$, $Ca_2MgSi_2O_7:Eu^{2+},Mn^{2+}$, $CaMoO_4$, $CaMoO_4:Eu^{3+}$, $CaO:Bi^{3+}$, $CaO:Cd^{2+}$, $CaO:Cu^+$, $CaO:Eu^{3+}$, $CaO:Eu^{3+}$, $Na^+$, $CaO:Mn^{2+}$, $CaO:Pb^{2+}$, $CaO:Sb^{3+}$, $CaO:Sm^{3+}$, $CaO:Tb^{3+}$, $CaO:Tl$, $CaO:Zn^{2+}$, $Ca_2P_2O_7:Ce^{3+}$, $\alpha$-$Ca_3(PO_4)_2:Ce^{3+}$, $\beta$-$Ca_3(PO_4)_2:Ce^{3+}$, $Ca_5(PO_4)_3Cl:EU^{2+}$, $Ca_5(PO_4)_3Cl:Mn^{2+}$, $Ca_5(PO_4)_3Cl:Sb^{3+}$, $Ca_5(PO_4)_3Cl:Sn^{2+}$, R—$Ca_3(PO_4)_2:Eu^{2+}$, $Mn^{2+}$, $Ca_5(PO_4)_3F:Mn^{2+}$, $Ca_5(PO_4)_3F:Sb^{3+}$, $Ca_5(PO_4)_3F:Sn^{2+}$, $\alpha$-$Ca_3(PO_4)_2:Eu^{2+}$, $\beta$-$Ca_3(PO_4)_2:Eu^{2+}$, $Ca_2P_2O_7:Eu^{2+}$, $Ca_2P_2O_7:Eu^{2+}$, $Mn^{2+}$, $CaP_2O_6:Mn^{2+}$, $\alpha$-$Ca_3(PO_4)_2:Pb^{2+}$, $\alpha$-$Ca_3(PO_4)_2:Sn^{2+}$, $\beta$-$Ca_3(PO_4)_2:Sn^{2+}$, $\beta$-$Ca_2P_2O_7:Sn$, $Mn$, $\alpha$-$Ca_3(PO_4)_2:Tr$, $CaS:Bi^{3+}$, $CaS:Bi^{3+},Na$, $CaS:Ce^{3+}$, $CaS:Eu^{2+}$, $CaS:Cu^+$, $Na^+$, $CaS:La^{3+}$, $CaS:Mn^{2+}$, $CaSO_4:Bi$, $CaSO_4:Ce^{3+}$, $CaSO_4:Ce^{3+},Mn^{2+}$, $CaSO_4:Eu^{2+}$, $CaSO_4:Eu^{2+},Mn^{2+}$, $CaSO_4:Pb^{2+}$, $CaS:Pb^{2+}$, $CaS:Pb^{2+}$, $Cl$, $CaS:Pb^{2+},Mn^{2+}$, $CaS:Pr^{3+},Pb^{2+}$, $Cl$, $CaS:Sb^{3+}$, $CaS:Sb^{3+}$, $Na$, $CaS:Sm^{3+}$, $CaS:Sn^{2+}$, $CaS:Sn^{2+}$, $F$, $CaS:Tb^{3+}$, $CaS:Tb^{3+}$, $Cl$, $CaS:Y^{3+}$, $CaS:Yb^{2+}$, $CaS:Yb^{2+}$, $Cl$, $CaSiO_3:Ce^{3+}$, $Ca_3SiO_4Cl_2:Eu^{2+}$, $Ca_3SiO_4Cl_2:Pb^{2+}$, $CaSiO_3:Eu^{2+}$, $Ca_3SiO_5:Eu^{2+}$, $(Ca,Sr)_3SiO_5:Eu^{2+}$, $(Ca,Sr)_3MgSi_2O_8:Eu^{2+}$, $(Ca,Sr)_3MgSi_2O_8:Eu^{2+},Mn^{2+}$, $CaSiO_3:Mn^{2+},Pb$, $CaSiO_3:Pb^{2+}$, $CaSiO_3:Pb^{2+},Mn^{2+}$, $CaSiO_3:Ti^{4+}$, $CaSr_2(PO_4)_2:Bi^{3+}$, $\beta$-$(Ca,Sr)_3(PO_4)_2:Sn^{2+}Mn^{2+}$, $CaTi_{0.9}Al_{0.1}O_3:Bi^{3+}$, $CaTiO_3:Eu^{3+}$, $CaTiO_3:Pr^{3+}$, $Ca_5(VO_4)_3Cl$, $CaWO_4$, $CaWO_4:Pb^{2+}$, $CaWO_4:W$, $Ca_3WO_6:U$, $CaYAlO_4:Eu^{3+}$, $CaYBO_4:Bi^{3+}$, $CaYBO_4:Eu^{3+}$, $CaYB_{0.8}O_{3.7}:Eu^{3+}$, $CaY_2ZrO_6:Eu^{3+}$, $(Ca,Zn,Mg)_3(PO_4)_2:Sn$, $CeF_3$, $(Ce,Mg)BaAl_{11}O_{18}:Ce$, $(Ce,Mg)SrAl_{11}O_{18}:Ce$, $CeMgAl_{11}O_{19}:Ce:Tb$, $Cd_2B_6O_{11}:Mn^{2+}$, $CdS:Ag^+,Cr$, $CdS:In$, $CdS:In$, $CdS:In$, $Te$, $CdS:Te$, $CdWO_4$, $CsF$, $CsI$, $CsI:Na^+$, $CsI:Tl$, $(ErCl_3)_{0.25}(BaCl_2)_{0.75}$, $GaN:Zn$, $Gd_3Ga_5O_{12}:Cr^{3+}$, $Gd_3Ga_5O_{12}:Cr,Ce$, $GdNbO_4:Bi^{3+}$, $Gd_2O_2S:Eu^{3+}$, $Gd_2O_2SPr^{3+}$, $Gd_2O_2S:Pr$, $Ce$, $F$, $Gd_2O_2S:Tb^{3+}$, $Gd_2SiO_5:Ce^{3+}$, $KAl_{11}O_{17}:Tl^+$, $KGa_{11}O_{17}:Mn^{2+}$, $K_2La_2Ti_3O_{10}:Eu$, $KMgF_3:Eu^{2+}$, $KMgF_3:Mn^{2+}$, $K_2SiF_6:Mn^{4+}$, $LaAl_3B_4O_{12}:Eu^{3+}$, $LaAlB_2O_6:Eu^{3+}$, $LaAlO_3:Eu^{3+}$, $LaAlO_3:Sm^{3+}$, $LaAsO_4:Eu^{3+}$, $LaBr_3:Ce^{3+}$, $LaBO_3:Eu^{3+}$, $(La,Ce,Tb)PO_4:Ce:Tb$, $LaCl_3:Ce^{3+}$, $La_2O_3:Bi^{3+}$, $LaOBr:Tb^{3+}$, $LaOBr:Tm^{3+}$, $LaOCl:Bi^{3+}$, $LaOCl:Eu^3$, $LaOF:Eu^{3+}$, $La_2O_3:Eu^{3+}$, $La_2O_3:Pr^{3+}$, $La_2O_2S:Tb^{3+}$, $LaPO_4:Ce^{3+}$, $LaPO_4:Eu^{3+}$, $LaSiO_3Cl:Ce^{3+}$, $LaSiO_3Cl:Ce^{3+},Tb^{3+}$, $LaVO_4:Eu^{3+}$, $La_2W_3O_{12}:Eu^{3+}$, $LiAlF_4:Mn^{2+}$, $LiAl_5O_8:Fe^{3+}$, $LiAlO_2:Fe^{3+}$, $LiAlO_2:Mn^{2+}$, $LiAl_5O_8:Mn^{2+}$, $Li_2CaP_2O_7:Ce^{3+},Mn^{2+}$, $LiCeBa_4Si_4O_{14}:Mn^{2+}$, $LiCeSrBa_3Si_4O_{14}:Mn^{2+}$, $LiInO_2:Eu^{3+}$, $LiInO_2:Sm^{3+}$, $LiLaO_2:Eu^{3+}$, $LuAlO_3:Ce^{3+}$, $(Lu,Gd)_2SiO_5:Ce^{3+}$, $Lu_2SiO_5:Ce^{3+}$, $Lu_2Si_2O_7:Ce^{3+}$, $LuTaO_4:Nb^{5+}$, $Lu_{1-x}Y_xAlO_3:Ce^{3+}$ (wherein $0 \le x \le 1$), $MgAl_2O_4:Mn^{2+}$, $MgSrAl_{10}O_{17}:Ce$, $MgB_2O_4:Mn^{2+}$, $MgBa_2(PO_4)_2:Sn^{2+}$, $MgBa_2(PO_4)_2:U$, $MgBaP_2O_7:Eu^{2+}$, $MgBaP_2O_7:Eu^{2+},Mn^{2+}$, $MgBa_3Si_2O_8:Eu^{2+}$, $MgBa(SO_4)_2:Eu^{2+}$, $Mg_3Ca_3(PO_4)_4:Eu^{2+}$, $MgCaP_2O_7:Mn^{2+}$, $Mg_2Ca(SO_4)_3:Eu^{2+}$, $Mg_2Ca(SO_4)_3:Eu^{2+}$, $Mn^{2+}$, $MgCeAnO_{19}:Tb^{3+}$, $Mg_4(F)GeO_6:Mn^{2+}$, $Mg_4(F)(Ge,Sn)O_6:Mn^{2+}$, $MgF_2:Mn^{2+}$, $MgGa_2O_4:Mn^{2+}$, $Mg_8Ge_2O_{11}F_2:Mn^{4+}$, $MgS:Eu^{2+}$, $MgSiO_3:Mn^{2+}$, $Mg_2SiO_4:Mn^{2+}$, $Mg_3SiO_3F_4:Ti^{4+}$, $MgSO_4:Eu^{2+}$, $MgSO_4:Pb^{2+}$, $(Mg,Sr)Ba_2Si_2O_7:Eu^{2+}$, $MgSrP_2O_7:Eu^{2+}$, $MgSr_5(PO_4)_4:Sn^{2+}$, $MgSr_3Si_2O_8:Eu^{2+},Mn^{2+}$, $Mg_2Sr(SO_4)_3:Eu^{2+}$, $Mg_2TiO_4:Mn^{4+}$, $MgWO_4$, $MgYBO_4:Eu^{3+}$, $M_2MgSi_2O_7:Eu^{2+}$ (M=Ca, Sr, and/or Ba), $M2MgSi_2O_7:Eu^{2+},Mn^{2+}$ (M=Ca, Sr, and/or Ba), $M2MgSi_2O_7:Eu^{2+}$, $Zr^{4+}$ (M=Ca, Sr, and/or Ba), $M2MgSi_2O_7:Eu^{2+}$, $Mn^{2+}$, $Zr^{4+}$ (M=Ca, Sr, and/or Ba), $Na_3Ce(PO_4)_2:Tb^{3+}$, NaI:Tl, $Na_{1.23}K_{0.42}Eu_{0.12}TiSi_4O_{11}:EU^{3+}$, $Na_{1.23}K_{0.42}Eu_{0.12}TSi_5O_{13}\cdot xH_2O:EU^{3+}$, $Na_{1.29}K_{0.46}Er_{0.08}TiSi_4O_{11}:Eu^{3+}$, $Na_2Mg_3Al_2Si_2O_{10}:Tb$, $Na(Mg_{2-x}Mn_x)LiSi_4O_{10}F_2:Mn$ (wherein $0 \le x \le 2$), $NaYF_4:Er^{3+}$, $Yb^{3+}$, $NaYO_2:Eu^{3+}$, P46 (70%)+P47 (30%), $SrAl_{12}O_{19}:Ce^{3+}$, $Mn^{2+}$, $SrAl_2O_4:Eu^{2+}$, $SrAl_4O_7:Eu^{3+}$, $SrAl_{12}O_{19}:Eu^{2+}$, $SrAl_2S_4:Eu^{2+}$, $Sr_2B_5O_9Cl:Eu^{2+}$, $SrB_4O_7:Eu^{2+}$ (F,Cl,Br), $SrB_4O_7:Pb^{2+}$, $SrB_4O_7:Pb^{2+}$, $Mn^{2+}$, $SrB_8O_{13}:Sm^{2+}$, $Sr_xBa_yCl_zAl_2O_{4-z/2}:Mn^{2+}$, $Ce^{3+}$, $SrBaSiO_4:Eu^{2+}$, $Sr(Cl,Br,I)_2:Eu^{2+}$ in $SiO_2$, $SrCl_2:Eu^{2+}$ in $SiO_2$, $Sr_5Cl(PO_4)_3:Eu$, $Sr_wF_xB_4O_{6.5}:Eu^{2+}$, $Sr_wF_xB_yO_z:Eu^{2+}$, $Sm^{2+}$, $SrF_2:Eu^{2+}$, $SrGa_{12}O_{19}:Mn^{2+}$, $SrGa_2S_4:Ce^{3+}$, $SrGa_2S_4:Eu^{2+}$, $Sr_{2-y}Ba_ySiO_4:Eu$ (wherein $0 \le y \le 2$), $SrSi_2O_2N_2:Eu$, $SrGa_2S_4:Pb^{2+}$, $SrIn_2O_4:Pr^{3+}$, $Al^{3+}$, $(Sr,Mg)_3(PO_4)_2:Sn$, $SrMgSi_2O_6:Eu^{2+}$, $Sr_2MgSi_2O_7:Eu^{2+}$, $Sr_3MgSi_2O_8:Eu^{2+}$, $SrMoO_4:U$, $SrO\cdot 3B_2O_3:Eu^{2+},Cl$, $\beta\text{-}SrO\cdot 3B_2O_3:Pb^{2+}$, $\beta\text{-}SrO\cdot 3B_2O_3:Pb^{2+}$, $Mn^{2+}$, $\alpha\text{-}SrO\cdot 3B_2O_3:Sm^{2+}$, $Sr_6P_5BO_{20}:Eu$, $Sr(PO_4)_3Cl:Eu^{2+}$, $Sr(PO_4)_3Cl:Eu^{2+},Pr^{3+}$, $Sr_5(PO_4)_3Cl:Mn^{2+}$, $Sr_5(PO_4)_3Cl:Sb^{3+}$, $Sr_2P_2O_7:Eu^{2+}$, $\beta\text{-}Sr_3(PO_4)_2:Eu^{2+}$, $Sr_5(PO_4)_3F:Mn^{2+}$, $Sr_5(PO_4)_3F:Sb^{3+}$, $Sr_5(PO_4)_3F:Sb^{3+}$, $Mn^{2+}$, $Sr_5(PO_4)_3F:Sn^{2+}$, $Sr_2P_2O_7:Sn^{2+}$, $\beta\text{-}Sr_3(PO_4)_2:Sn^{2+}$, $\beta\text{-}Sr_3(PO_4)_2:Sn^{2+},Mn^{2+}$ (Al), $SrS:Ce^{3+}$, $SrS:Eu^{2+}$, $SrS:Mn^{2+}$, $SrS:Cu^+,Na$, $SrSO_4:Bi$, $SrSO_4:Ce^{3+}$, $SrSO_4:Eu^{2+}$, $SrSO_4:Eu^{2+},Mn^{2+}$, $Sr_5Si_4O_{10}Cl_6:Eu^{2+}$, $Sr_2SiO_4:Eu^{2+}$, $Sr_3SiO_5:Eu^{2+}$, $(Sr,Ba)_3SiO_5:Eu^{2+}$, $SrTiO_3:Pr^{3+}$, $SrTiO_3:Pr^{3+}$, $Al^{3+}$, $Sr_3WO_6:U$, $SrY_2O_3:Eu^{3+}$, $ThO_2:Eu^{3+}$, $ThO_2:Pr^{3+}$, $ThO_2:Tb^{3+}$, $YAl_3B_4O_{12}:Bi^{3+}$, $YAl_3B_4O_{12}:Ce^{3+}$, $YAl_3B_4O_{12}:Ce^{3+},Mn$, $YAl_3B_4O_{12}:Ce^{3+},Tb^{3+}$, $YAl_3B_4O_{12}:Eu^{3+}$, $YAl_3B_4O_{12}:Eu^{3+}$, $Cr^{3+}$, $YAl_3B_4O_{12}:Tb^{4+}$, $Ce^{3+}$, $Mn^{2+}$, $YAlO_3:Ce^{3+}$, $Y_3Al_5O_{12}:Ce^{3+}$, $Y_3Al_5O_{12}:Cr^{3+}$, $YAlO_3:Eu^{3+}$, $Y_3Al_5O_{12}:Eu^{3+}r$, $Y_4Al_2O_9:Eu^{3+}$, $Y_3Al_5O_{12}:Mn^{4+}$, $YAlO_3:Sm^{3+}$, $YAlO_3:Tb^{3+}$, $Y_3Al_{5012}:Tb^{3+}$, $YAsO_4:Eu^{3+}$, $YBO_3:Ce^{3+}$, $YBO_3:Eu^{3+}$, $YF_3:Er^{3+},Yb^{3+}$, $YF_3:Mn^{2+}$, $YF_3:Mn^{2+}$, $Th^{4+}$, $YF_3:Tm^{3+}$, $Yb^{3+}$, $(Y,Gd)BO_3:Eu$, $(Y,Gd)BO_3:Tb$, $(Y,Gd)_2O_3:Eu^{3+}$, $Y_{1.34}Gd_{0.60}O_3(Eu,Pr)$, $Y_2O_3:Bi^{3+}$, YOBr: $Eu^{3+}$, $Y_2O_3:Ce$, $Y_2O_3:Er^{3+}$, $Y_2O_3:Eu^{3+}(YOE)$, $Y_2O_3:Ce^{3+}$, $Tb^{3+}$, $YOCl:Ce^{3+}$, $YOCl:Eu^{3+}$, $YOF:Eu^{3+}$, $YOF:Tb^{3+}$, $Y_2O_3:Ho^{3+}$, $Y_2O_2S:Eu^{3+}$, $Y_2O_2S:Pr^{3+}$, $Y_2O_2S:Tb^{3+}$, $Y_2O_3:Tb^{3+}$, $YPO_4:Ce^{3+}$, $YPO_4:Ce^{3+},Tb^{3+}$, $YPO_4:Eu^{3+}$, $YPO_4:Mn^{2+},Th^{4+}$, $YPO_4:V^{5+}$, $Y(P,V)O_4:Eu$, $Y_2SiO_5:Ce^{3+}$, $YTaO_4$, $YTaO_4:Nb^{5+}$, $YVO_4:Dy^{3+}$, $YVO_4:Eu^{3+}$, $ZnAl_2O_4:Mn^{2+}$, $ZnB_2O_4:Mn^{2+}$, $ZnBa_2S_3:Mn^{2+}$, $(Zn,Be)_2SiO_4:Mn^{2+}$, $Zn_{0.4}Cd_{0.6}S:Ag$, $Zn_{0.6}Cd_{0.4}S:Ag$, (Zn,Cd)S:Ag,Cl, (Zn,Cd)S:Cu, $ZnF_2:Mn^{2+}$, $ZnGa_2O_4$, $ZnGa_2O_4:Mn^{2+}$, $ZnGa_2S_4:Mn^{2+}$, $Zn_2GeO_4:Mn^{2+}$, $(Zn,Mg)F_2:Mn^{2+}$, $ZnMg_2(PO_4)_2:Mn^{2+}$, $(Zn,Mg)_3(PO_4)_2:Mn^{2+}$, $ZnO:Al^{3+}$, $Ga^{3+}$, $ZnO:Bi^{3+}$, $ZnO:Ga^{3+}$, $ZnO:Ga$, ZnO—CdO:Ga, ZnO:S, ZnO:Se, ZnO:Zn, $ZnS:Ag^+,Cl^-$, ZnS:Ag,Cu,Cl, ZnS:Ag,Ni, ZnS:Au,In, ZnS—CdS (25-75), ZnS—CdS (50-50), ZnS—CdS (75-25), ZnS—CdS:Ag, Br, Ni, ZnS—CdS:$Ag^+$,Cl, ZnS—CdS:Cu, Br, ZnS—CdS:Cu,1, ZnS:$Cl^-$, ZnS:$Eu^{2+}$, ZnS:Cu, ZnS:$Cu^+$, $Al^{3+}$, ZnS:$Cu^+$, $Cl^-$, ZnS:Cu,Sn, ZnS:$Eu^{2+}$, ZnS:$Mn^{2+}$, ZnS:Mn,Cu, ZnS:$Mn^{2+}$, $Te^{2+}$, ZnS:P, ZnS:$P^{3-}$, $Cl^-$, ZnS:$Pb^{2+}$, ZnS:$Pb^{2+}$, $Cl^-$, ZnS:Pb, Cu, $Zn_3(PO_4)_2:Mn^{2+}$, $Zn_2SiO_4:Mn^{2+}$, $Zn_2SiO_4:Mn^{2+}$, $As^{5+}$, $Zn_2SiO_4:Mn$, $Sb_2O_2$, $Zn_2SiO_4:Mn^{2+}$, P, $Zn_2SiO_4:Ti^{4+}$, ZnS:$Sn^{2+}$, ZnS:Sn, Ag, ZnS:$Sn^{2+}$, $Li^+$, ZnS:Te, Mn, ZnS—ZnTe:$Mn^{2+}$, ZnSe:$Cu^+$, Cl and/or $ZnWO_4$.

In a preferred embodiment of the present invention the formulation contains at least one phosphor, more preferably one, two or three or more phosphors in combination.

For the purpose of the present application, the type of semiconductor nanoparticle converter is not particularly limited. Such converters may be semiconductor nanoparticles (quantum materials) or semiconductor nanoparticles (quantum materials) which are provided on the surface of non-activated crystalline materials as known from WO 2017/041875 A1 and described above.

In a preferred embodiment of the present invention the formulation contains at least one semiconductor nanoparticle converter, more preferably two, three or more semiconductor nanoparticle converters in combination.

In a particularly preferred embodiment of the present invention the formulation contains at least one phosphor and at least one semiconductor nanoparticle converter in combination.

Optoelectronic Device

The present invention further relates to an optoelectronic device which is obtained or obtainable by the manufacturing according to the present invention. The optoelectronic device is prepared from an optoelectronic device precursor and a formulation comprising (i) a polymer containing a silazane repeating unit $M^1$, and (ii) at least one wavelength converting material. Said formulation is applied to the optoelectronic device precursor and converted by a specific precuring and curing treatment into a wavelength converting layer where the wavelength converting material is embedded in a matrix formed by the cured polymer containing a silazane repeating unit $M^1$. Said polymer acts as a binder (encapsulation material or encapsulant) for the wavelength converting material.

In a preferred embodiment, the optoelectronic device precursor is an LED precursor or an micro-LED precursor. LED or micro-LED precursors contain a primary light source. Preferred primary light sources are semiconductor light emitting sources such as semiconductor light emitting diodes (LED or micro-LED chips) or semiconductor laser diodes (LD chips). Preferred LED or micro-LED chips comprise a luminescent indium aluminum gallium nitride, in particular of the formula $In_iGa_jAl_kN$, where $0 \le i$, $0 \le j$, $0 \le k$, and $i+j+k=1$. In a further preferred embodiment, the LED chip is a luminescent arrangement based on ZnO, TCO (transparent conducting oxide), ZnSe or SiC.

Thus, it is preferred that the optoelectronic device of the present invention is a wavelength converting optoelectronic device such as e.g. a LED or micro-LED.

The LED or micro-LED preferably emits white light or light having a certain colour point (colour-on-demand principle). LEDs may be used as light sources in a lighting unit and micro-LEDs may be used as pixels in micro-LED displays.

The present invention is further illustrated by the examples following hereinafter which shall in no way be construed as limiting. The skilled person will acknowledge that various modifications, additions and alternations may be made to the invention without departing from the spirit and scope of the invention as defined in the appended claims.

EXAMPLES

The organopolysiloxazane Material A used in the following examples has the structure shown in Formula A and is synthesized according to Example 5 described in WO 2017/140407 A1.

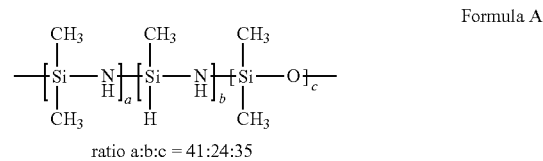

Formula A ratio a:b:c = 41:24:35

Radiation Sources

The IR emitter used in the following examples was a "SIP Strahler", available from IBT.InfraBioTech GmbH Germany. The IR emitter was operated at 80% power and placed at a distance of 5 cm from the surface of the LED device to be cured.

The UV emitter used in the following examples was a "UVA Cube 2000" and a "Lamp-HOZFR", available from Dr. Hönle AG Germany. The UV lamp was operated at 100% power and placed at a distance of 25 cm from the surface of the LED device to be cured.

Measurement Methods

FT-IR spectra were recorded using a Perkin-Elmer Frontier FT-IR Spectrometer in ATR mode. A 150 µm film was coated on a glass plate, cured by heat or irradiation and the FT-TR spectrum was measured in ATR mode.

The emission spectra and the colour point of the coated LEDs were measured using an Instrument System Spectrometer CAS 140CT in combination with an Instrument System Integration sphere ISP 150. A generally tolerated deviation of colour coordinates after 1500 h is +/−1% which corresponds to a change in the colour coordinates of +/−0.01.

Example 1: IR Curing

Figure 8:
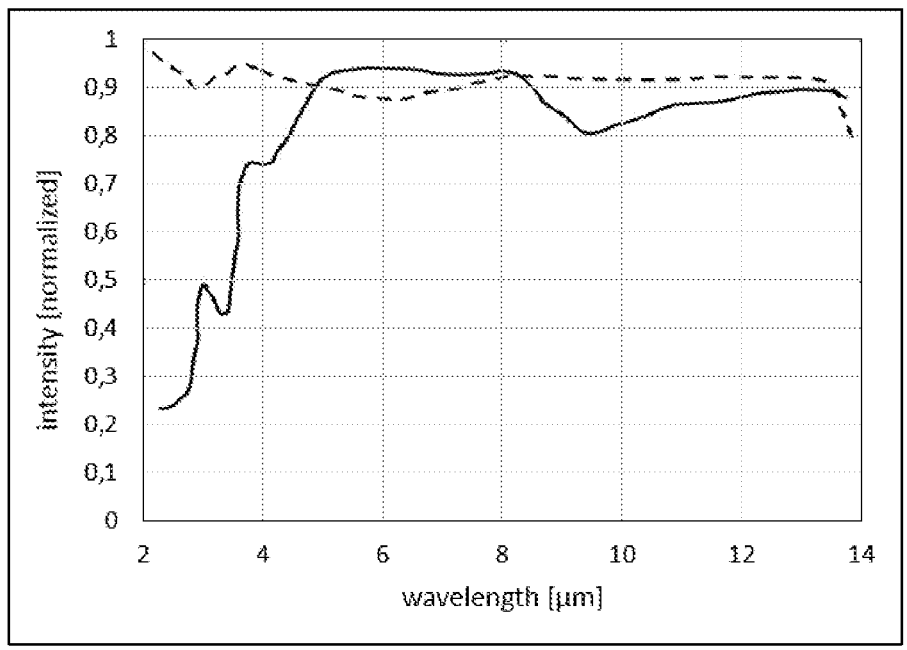
FIG. 8: Emission spectra of IR emitters "metal radiator+STIR" (black line), available from IBT InfraBiotech GmbH, Germany.
———— =ceramic emitter;
— — =metal emitter+STIR.

A dispersion of 10 g of the organopolysiloxazane Material A, 15 g phosphor (YGA 200 547) and 50 ml ethyl acetate was sprayed on an Excelitas LED package (LED precursor) in three layers of each ca. 10 µm thickness in average. After spraying of each layer the LED package was exposed to an IR emitter described in FIG. 8 for 1 min. After the 1 min exposure the coating was dry-to-touch and the colour coordinates were measured. Then the process was repeated: spraying three layers, curing each layer by IR exposure and finally measuring the colour coordinates. The data obtained from both colour-point measurements were used to calculate the number of the remaining layers necessary to reach the target colour point of x/y=0.400/0.377. After spraying the required number of the calculated remaining layers (usually 2, 3 or 4) and curing each layer by IR exposure, the LED package was finally cured on a hotplate at 220° C. for 4 h. This process was used to prepare a number of 25 LEDs to have a proper statistic. The colour point of each single LED was measured before and after the final curing at 220° C. for 4 h. The data was used to calculate the colour coordinate shift occurring during final curing and the standard deviation of the x- and y-colour coordinates after final curing. The results are shown in Table 1.

FIG. 1 shows the colour coordinate shift resulting after final curing, wherein the colour coordinates before final curing are set to zero.

Example 2: UV-C Curing

Figure 9:
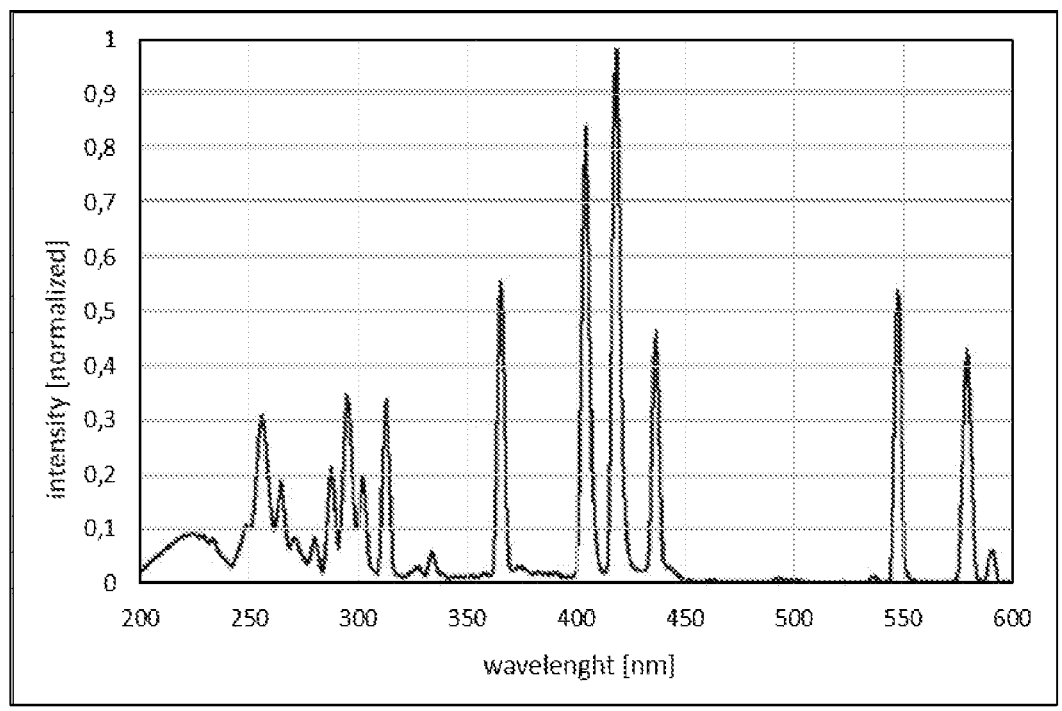
FIG. 9: Emission spectrum of UV-C emitter "Hg Z1", available from Peschl Ultraviolett GmbH, Germany.

25 LEDs were prepared according to the procedure described in Example 1, except that the IR exposure was replaced by UV-C exposure for 1 min with a UV-lamp as described in FIG. 9. The results are shown in Table 1.

Figure 2:
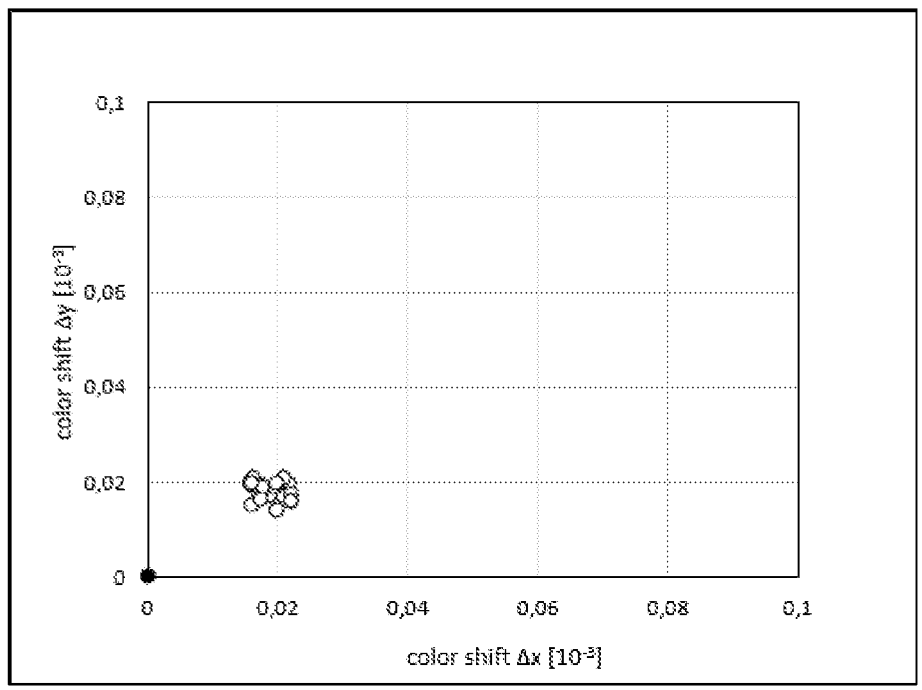
FIG. 2: Colour coordinates measured in Example 2 before and after final curing on a hotplate at 220° C. for 4 h.
●=before curing;
○=after curing.

FIG. 2 shows the colour coordinate shift resulting after final curing, wherein the colour coordinates before final curing are set to zero.

Example 3 (Reference Example): Thermal Curing

Figure 3:
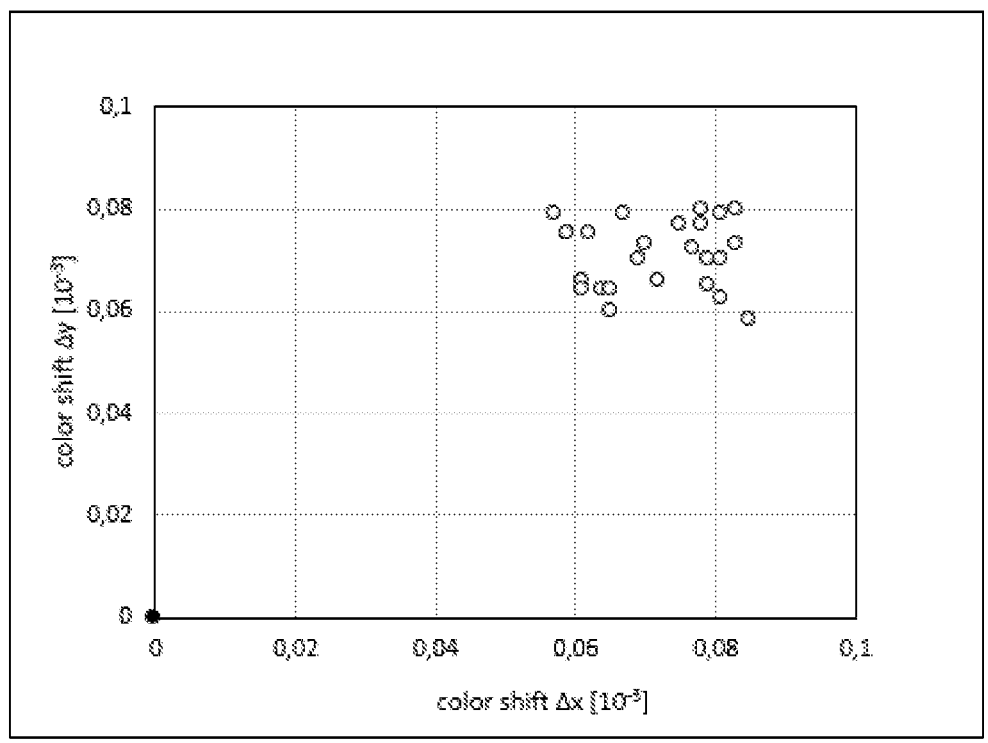
FIG. 3: Colour coordinates measured in Example 3 (reference example) before and after final curing on a hotplate at 220° C. for 4 h.
●=before curing;
○=after curing.

25 LEDs were prepared according to the procedure described in Example 1, except that the IR exposure was replaced by thermal curing on a hotplate at 150° C. for 1 min. After the thermal curing the coating was still sticky. The results are shown in Table 1. FIG. 3 shows the colour coordinate shift resulting after final curing, wherein the colour coordinates before final curing are set to zero.

TABLE 1

Standard deviation σ of the colour coordinates x and y and average colour point shift of x- and y-coordinate after full curing, calculated for 25 devices.

| Example | σ x-coordinate | σ y-coordinate | average colour point shift x-coordinate | average colour point shift y-coordinate |
|---|---|---|---|---|
| Example 1 (IR) | 0.0025 | 0.0028 | 0.016 | 0.015 |
| Example 2 (UV-C) | 0.0023 | 0.0023 | 0.019 | 0.018 |
| Example 3 (reference, thermal curing) | 0.0072 | 0.0063 | 0.071 | 0.071 |

The standard deviation a of the colour coordinates x and y of the IR- and UV-precured LEDs is much smaller when compared to the thermally cured reference LEDs. This demonstrates the usefulness of the UV and IR precuring in the spray coating process to improve the precision of the colour point and to reduce the colour point shift caused by the final curing at 220° C. for 4 h.

As an alternative, the final curing of the precured LED, which is effected by heat treatment at 220° C. for 4, may be effected by irradiation treatment in a much shorter time.

Example 4

10 LEDs were prepared according to the procedure described in Example 1.

Example 5

10 LEDs were prepared according to the procedure described in Example 4, except that the final curing was effected by exposure to IR light for 5 min.

Example 6

10 LEDs were prepared according to the procedure described in Example 4, except that the final curing was effected by exposure to UV-C light for 2 min.

Example 7

10 LEDs were prepared according to the procedure described in Example 4, except that the final curing was effected on a hotplate at 150° C. for 4 h.

Example 8 (Reference Example)

10 LEDs were prepared according to the procedure described in Example 7, except that the organopolysiloxazane Material A was replaced by methyl silicone (OE-6370, available from Dow Corning).

Reliability Test

Figure 4:
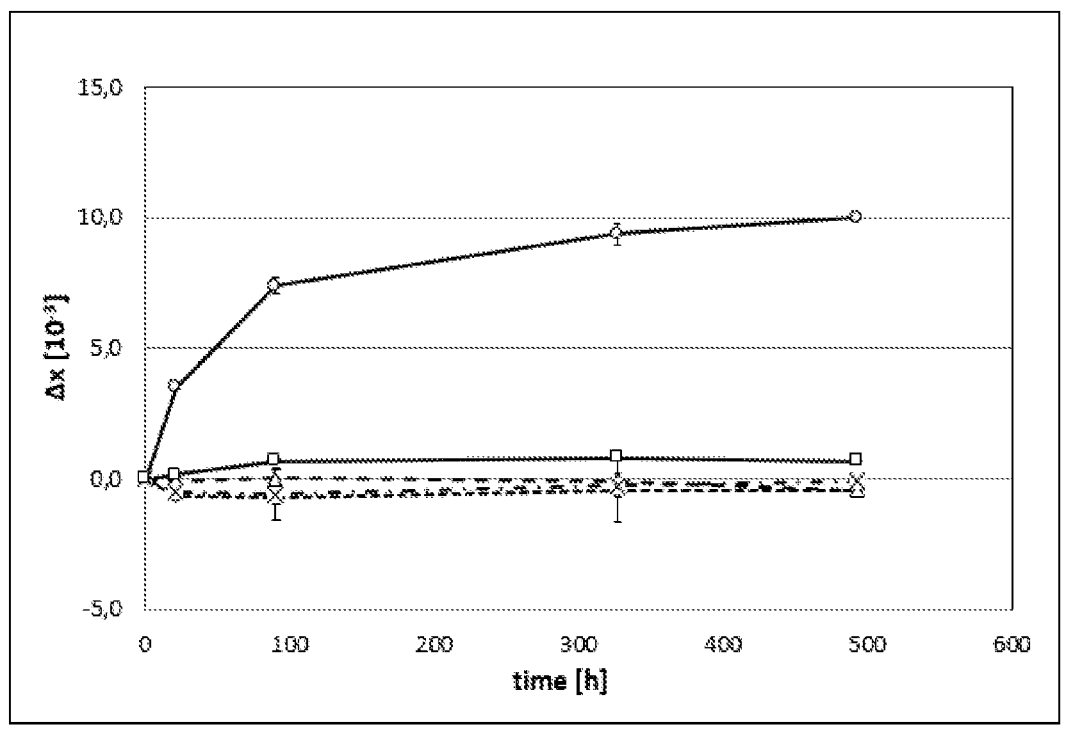
FIG. 4: Colour coordinate change Δx measured in reliability tests.
——○——=LEDs of Example 7, final curing 1 h at 150° C., hotplate;
— —◇— —=LEDs of Example 4, final curing 4 h at 220° C., hotplate;
— —△— —=LEDs of Example 6, final curing 2 min UV-C exposure;
— —✕— —=LEDs of Example 5, final curing 5 min ST-IR exposure;
——□——=LEDs of Example 8 (reference example), methyl silicone, final curing 4 h at 150° C., hotplate.
Figure 5:
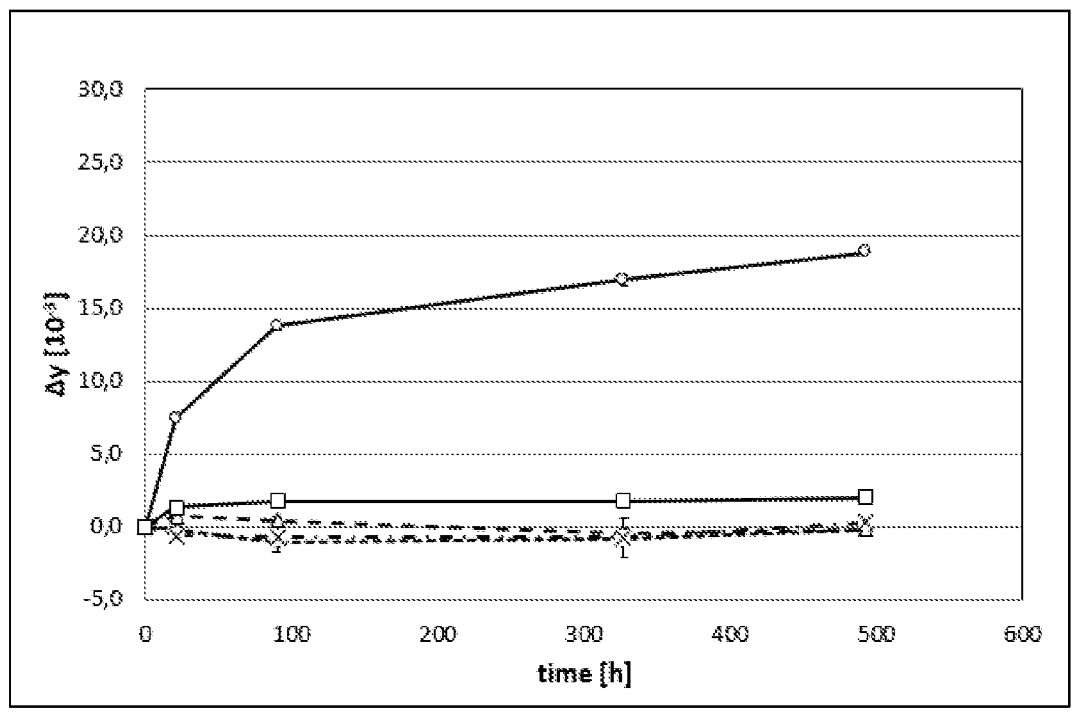
FIG. 5: Colour coordinate change Δy measured in reliability tests.
——○——=LEDs of Example 7, final curing 1 h at 150° C., hotplate;
— —◇— —=LEDs of Example 4, final curing 4 h at 220° C., hotplate;
— —△— —=LEDs of Example 6, final curing 2 min UV-C exposure;
— —✕— —=LEDs of Example 5, final curing 5 min ST-IR exposure;
——□——=LEDs of Example 8 (reference example), methyl silicone, final curing 4 h at 150° C., hotplate.

The LEDs were submitted to a reliability test at a current of 1.5 A for 500 h. The colour coordinates of the LEDs were measured at time t=0 and after 20 h, 90 h, 330 h and finally after 500 h. The change in colour coordinates relative to the colour coordinate at t=0 was plotted in FIGS. 4 and 5.

The example, where the organopolysilazane was cured at 150° C. for 4 h shows, a significant colour coordinate change, since the curing temperature is not high enough to fully cure the material. In contrast, the example where the organopolysilazane was cured at 220° C. for 4 h shows no colour coordinate change, whereas the reference example where methyl silicone was employed shows a slight colour coordinate change. The examples, where the final curing was carried out by exposure to UV-light for 2 min or to IR light for 5 min, show very similar colour coordinate changes close to zero. This demonstrates the usefulness of UV and IR irradiation curing as replacement for thermal curing in LED manufacturing.

Figure 6:
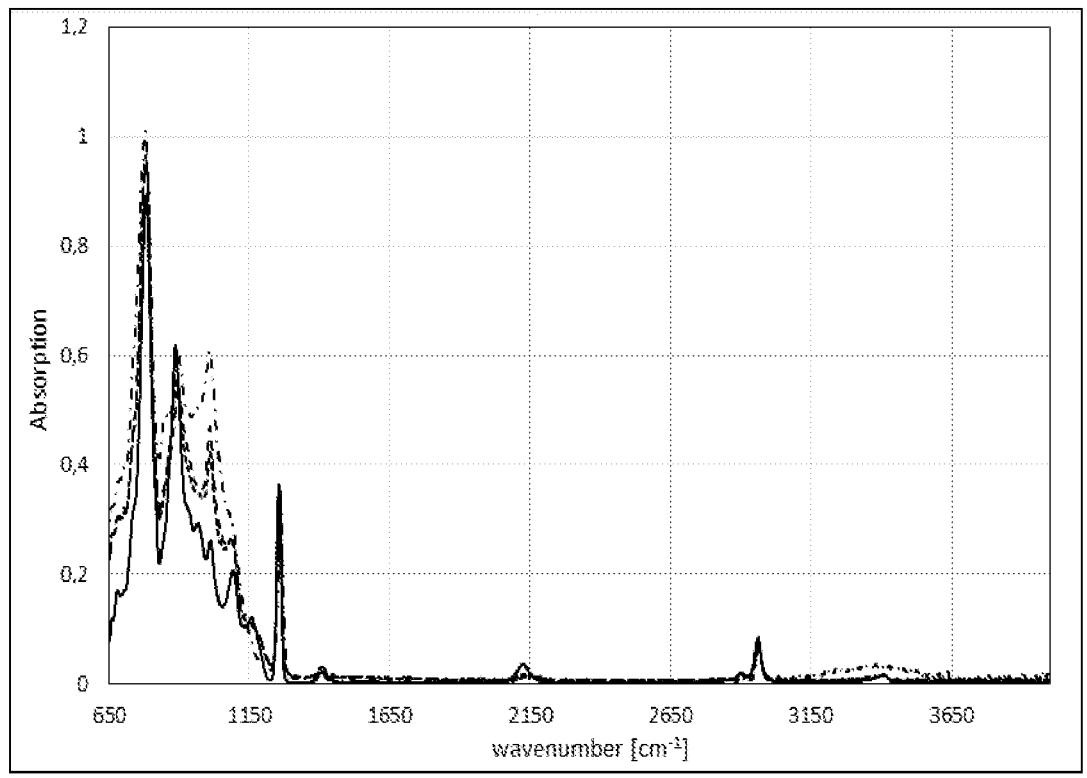
FIG. 6: FT-IR spectra of the materials of Examples 9, 10 and 11 in comparison to the FT-IR spectrum of the untreated material.
———— =Material A, untreated;
- - - - - - - =Material A after 4 h at 220° C. on hotplate;
— — — — — =Material A after 3 min exposure to IR light;
- · - · - · - =Material A after 2 min exposure to UV light.

To demonstrate the efficiency of IR and UV-C exposure versus hotplate curing, the organopolysiloxazane Material A was coated on glass plates by doctor-blade coating at a film thickness of 75 μm. One coated glass plate was cured at 220° C. for 4 h on a hotplate (Example 9), another coated glass plate was cured by IR exposure for 3 min (Example 10) and another coated glass plate was cured by UV-C exposure for 2 min (Example 11). The coatings were then analyzed by FT-IR to check the chemical conversion of the siloxazane material. See FIG. 6.

The chemical conversion of the IR and UV-C exposed materials is similar or higher than the conversion of the heat treated (220° C. for 4 h) material. This result shows that a much faster conversion is induced by irradiation compared to hotplate heating.

Figure 7:
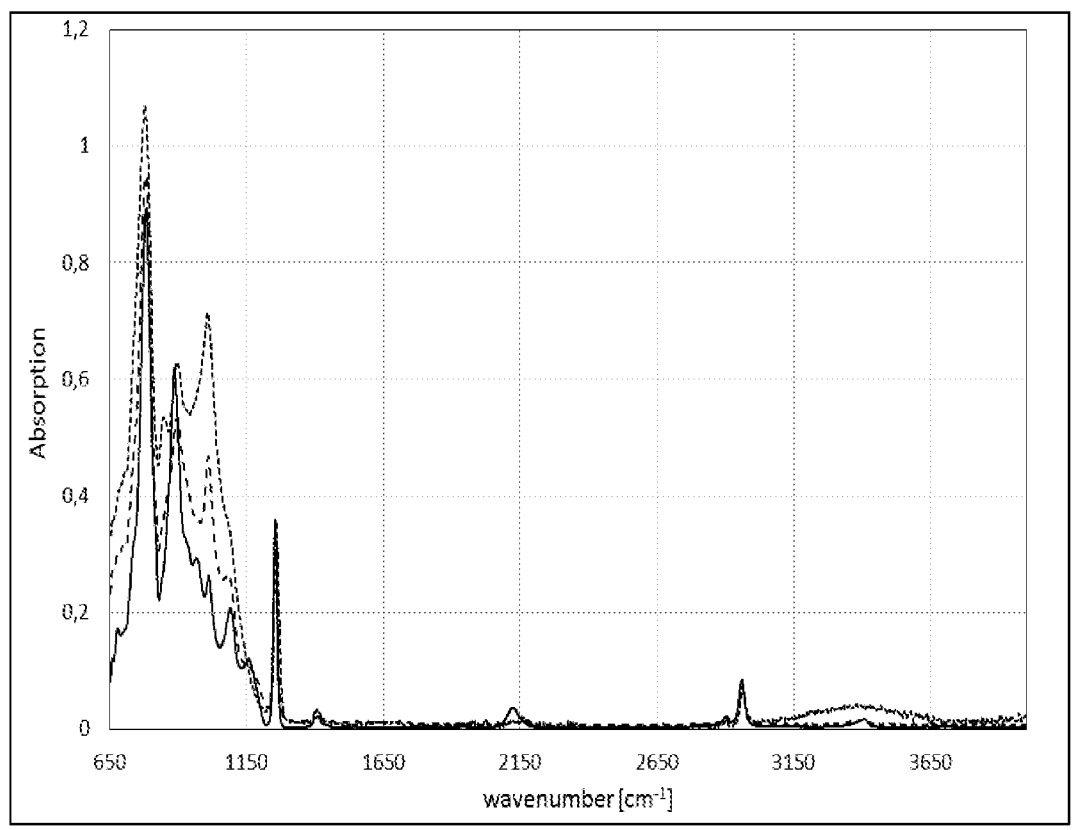
FIG. 7: FT-IR spectrum of the material of Example 12 in comparison to the FT-IR spectrum of the untreated material.
———— =Material A, untreated;
- - - - - - - =Material A after 3 min exposure to IR light;
— — — — — =Material A+catalyst after 1.5 min exposure to IR light.

To demonstrate the efficiency of catalyst addition, the organopolysiloxazane Material A was mixed with 0.5% triphenyl borane, and the mixture was coated on a glass plate by doctor-blade coating at a film thickness of 75 μm and stored in a vacuum oven for 30 min at 50° C. under a pressure of 25 mbar to remove the solvent. The coated glass plate was then cured by exposure to IR light for 1.5 min (Example 12). The coating was then analyzed by FT-IR to check the chemical conversion of the siloxazane material. See FIG. 7.

The conversion of the catalyst containing formulation is higher than the conversion of the non-catalyst containing material, even though the exposure time is only 1.5 min instead of 3.0 min. This clearly demonstrates the efficiency of catalyst addition.

The invention claimed is:

1. A process for manufacturing an optoelectronic device comprising the following steps:
   (a-1) applying a layer of a formulation comprising (i) a polymer containing a silazane repeating unit $M^1$, and (ii) at least one wavelength converting material to an optoelectronic device precursor;
   (a-2) precuring the layer on the precursor by exposure to radiation, wherein steps (a-1) and (a-2) are successively carried out two or more times so that a precursor comprising two or more precured layers is obtained; and
   (b) curing the precured layers on the precursor by exposure to heat or radiation
   wherein the silazane repeating unit $M^1$ is represented by formula (I):

$$-[-SiR^1R^2-NR^3-]-\qquad (I)$$

wherein $R^1$, $R^2$ and $R^3$ are independently from each other hydrogen or alkyl; and wherein the polymer contains a further repeating unit $M^2$, wherein $M^2$ is represented by formula (II):

$$-[-SiR^4R^5-NR^6-]-\qquad (II)$$

wherein $R^4$, $R^5$ and $R^6$ are independently from each other hydrogen or alkyl; and
wherein $M^2$ is different from $M^1$.

2. The process according to claim 1, wherein the layer of the formulation is applied in step (a-1) by any application method selected from dispensing, dipping, screen printing, stencil printing, roller coating, spray coating, slot coating, spin coating or inkjet printing.

3. The process according to claim 1, wherein the radiation for the precuring in step (a-2) is selected from the list consisting of UV light, visible light and IR light.

4. The process according to claim 1, wherein the exposure to radiation in step (a-2) takes place for a period of 1 second to 10 minutes.

5. The process according to claim 4, wherein the layer of the formulation applied in step (a-1) has an average thickness of 1 to 20 μm.

6. The process according to claim 1, wherein $R^1$, $R^2$ and $R^3$ in formula (I) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

7. The process according to claim 1, wherein $R^4$, $R^5$ and $R^6$ in formula (II) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

8. The process according to claim 1, wherein the polymer contains a further repeating unit $M^3$, wherein $M^3$ is represented by formula (III):

$$-[-SiR^7R^8-[O-SiR^7R^8-]_a-NR^9-]-\qquad (III)$$

wherein
$R^7$, $R^8$, $R^9$ are independently from each other hydrogen or alkyl; and
a is an integer from 1 to 60.

9. The process according to claim 8, wherein $R^7$, $R^8$ and $R^9$ in formula (III) are independently from each other selected from the group consisting of hydrogen, straight-chain alkyl having 1 to 12 carbon atoms, branched-chain alkyl having 3 to 12 carbon atoms and cycloalkyl having 3 to 12 carbon atoms.

10. The process according to claim 8, wherein $R^1$, $R_2$, $R_3$, $R_4$, $R_5$, $R_6$, $R^7$, $R^8$ and $R^9$ are independently selected from hydrogen, methyl, ethyl, n-propyl, n-butyl, n-pentyl, n-hexyl, iso-propyl, sec-butyl, iso-butyl, tert-butyl, sec-pentyl, 3-pentyl, iso-pentyl, neo-pentyl, tert-pentyl, cyclopropyl, cyclobutyl, cyclopentyl, and cyclohexyl.

11. The process according to claim 1, wherein the at least one wavelength converting material is selected from phosphors or semiconductor nanoparticles.

12. The process according to claim 1, wherein the precursor is selected from a light emitting device (LED) precursor or a micro-light emitting device (micro-LED) precursor.

13. An optoelectronic device which is obtainable by the process according to claim 1.

14. An optoelectronic device according to claim 13 which is a light emitting device (LED) or a micro-light emitting device (micro-LED).

15. The process according to claim 1, wherein the radiation for the precuring in step (a-2) has a wavelength from 200 to 350 nm.

16. The process according to claim 1, wherein the radiation for the precuring step (a-2) has a wavelength from 5 to 15 μm.

17. The process according to claim 1, wherein the exposure to radiation in step (a-2) takes place for a period of 10 second to 7 minutes, and wherein the layer of the formulation applied in step (a-1) has an average thickness of 2 to 15 μm.

18. A process for manufacturing an optoelectronic device comprising the following steps:
(a-1) applying a layer of a formulation comprising (i) a polymer containing a silazane repeating unit $M^1$, and (ii) at least one wavelength converting material to an optoelectronic device precursor;
(a-2) precuring the layer on the precursor by exposure to radiation, wherein steps (a-1) and (a-2) are successively carried out two or more times so that a precursor comprising two or more precured layers is obtained; and
(b) curing the precured layers on the precursor by exposure to heat or radiation wherein the silazane repeating unit $M^1$ is represented by formula (I):

$$-[-SiR^1R^2-NR^3-]- \quad (I)$$

wherein $R^1$, $R^2$ and $R^3$ are independently from each other hydrogen or alkyl; and wherein the polymer contains a further repeating unit $M^3$, wherein $M^3$ is represented by formula (III):

$$-[-SiR^7R^8-[O-SiR^7R^8-]_a-NR^9-]- \quad (III)$$

wherein
$R^7$, $R^8$, $R^9$ are independently from each other hydrogen or alkyl; and
a is an integer from 1 to 60.

* * * * *